(12) United States Patent
Yamamoto et al.

(10) Patent No.: US 8,742,534 B2
(45) Date of Patent: Jun. 3, 2014

(54) SEMICONDUCTOR DEVICE HAVING LATERAL DIODE

(75) Inventors: Takao Yamamoto, Nukata-gun (JP); Norihito Tokura, Okazaki (JP); Hisato Kato, Nagoya (JP); Akio Nakagawa, Chigasaki (JP)

(73) Assignee: DENSO CORPORATION, Kariya (JP)

( * ) Notice: Subject to any disclaimer, the term of this patent is extended or adjusted under 35 U.S.C. 154(b) by 154 days.

(21) Appl. No.: 13/197,719

(22) Filed: Aug. 3, 2011

(65) Prior Publication Data

US 2012/0032313 A1    Feb. 9, 2012

(30) Foreign Application Priority Data

Aug. 4, 2010 (JP) ................................. 2010-175464
May 27, 2011 (JP) ................................. 2011-118863

(51) Int. Cl.
*H01L 29/66* (2006.01)
*H01L 29/47* (2006.01)

(52) U.S. Cl.
USPC ........... 257/481; 257/199; 257/471; 257/551; 257/E29.327; 257/E29.328

(58) Field of Classification Search
USPC ......... 257/104, 106, 199, 212, 471, 481, 551, 257/603, 656, E27.044, E27.046, E27.051, 257/E29.327, E29.328, E29.335, E29.338, 257/E21.351, E21.352, E21.355
See application file for complete search history.

(56) References Cited

U.S. PATENT DOCUMENTS

| | | | |
|---|---|---|---|
| 5,072,287 A | 12/1991 | Nakagawa et al. | |
| 5,241,210 A | 8/1993 | Nakagawa et al. | |
| 5,294,825 A | 3/1994 | Nakagawa et al. | |
| 5,343,067 A | 8/1994 | Nakagawa et al. | |
| 5,378,920 A * | 1/1995 | Nakagawa et al. | 257/487 |
| 5,432,360 A * | 7/1995 | Kim et al. | 257/104 |
| 5,434,444 A | 7/1995 | Nakagawa et al. | |
| 5,438,220 A | 8/1995 | Nakagawa et al. | |

(Continued)

FOREIGN PATENT DOCUMENTS

| | | |
|---|---|---|
| JP | A-H04-162682 | 6/1992 |
| JP | A-H07-45841 | 2/1995 |
| JP | A-2002-009303 | 1/2002 |
| JP | A-2005-347367 | 12/2005 |
| JP | A-2006-164997 | 6/2006 |

OTHER PUBLICATIONS

Office Action mailed May 7, 2013 in corresponding JP Application No. 2011-118863 (and English translation).

(Continued)

*Primary Examiner* — Cuong Q Nguyen
*Assistant Examiner* — Galina Yushina
(74) *Attorney, Agent, or Firm* — Posz Law Group, PLC

(57) ABSTRACT

A semiconductor device having a lateral diode includes a semiconductor layer, a first semiconductor region in the semiconductor layer, a contact region having an impurity concentration greater than that of the first semiconductor region, a second semiconductor region located in the semiconductor layer and separated from the contact region, a first electrode electrically connected through the contact region to the first semiconductor region, and a second electrode electrically connected to the second semiconductor region. The second semiconductor region includes a low impurity concentration portion, a high impurity concentration portion, and an extension portion. The second electrode forms an ohmic contact with the high impurity concentration portion. The extension portion has an impurity concentration greater than that of the low impurity concentration portion and extends in a thickness direction of the semiconductor layer.

14 Claims, 36 Drawing Sheets

(56) References Cited

U.S. PATENT DOCUMENTS

| | | | |
|---|---|---|---|
| 5,536,961 | A | 7/1996 | Nakagawa et al. |
| 5,592,014 | A | 1/1997 | Funaki et al. |
| 5,640,040 | A | 6/1997 | Nakagawa et al. |
| 5,982,015 | A | 11/1999 | Hirayama et al. |
| 6,054,748 | A | 4/2000 | Tsukuda et al. |
| 6,150,702 | A * | 11/2000 | Funaki et al. ............ 257/409 |
| 2006/0244091 | A1 * | 11/2006 | Kikuchi et al. ............ 257/471 |
| 2010/0163973 | A1 * | 7/2010 | Nakamura et al. ......... 257/328 |

OTHER PUBLICATIONS

A. Nakagawa et al., "New 500V Output Device Structures for Thin Silicon Layer on Silicon Dioxide Film," Proceedings of 1990 Int'l Sympo on Power Semiconductor Devices & ICs, Tokyo, Toshiba Research and Development Center, pp. 97-101.

A. Nakagawa, "Impact of Dielectric Isolation Technology on Power ICs," downloaded on Nov. 14, 2008 from IEEE Xplore, Toshiba Research and Development Center, pp. 16-21.

T. Yamamoto et al., "Analysis of Dynamic Avalanche Phenomenon in SOI Lateral High Speed Diode During Reverse Recovery and Proposal of Novel Device Structure Suppressing the Dynamic Avalanche," pp. 1-7 (Nov. 29-30, 2010), IEEE (Joint Study Group) (English abstract enclosed).

Office Action mailed Oct. 23, 2012 in corresponding JP Application No. 2011-118863 (and English translation).

Office Action dated Oct. 30, 2013 in corresponding CN Application No. 201110226614.8 (and English translation).

\* cited by examiner

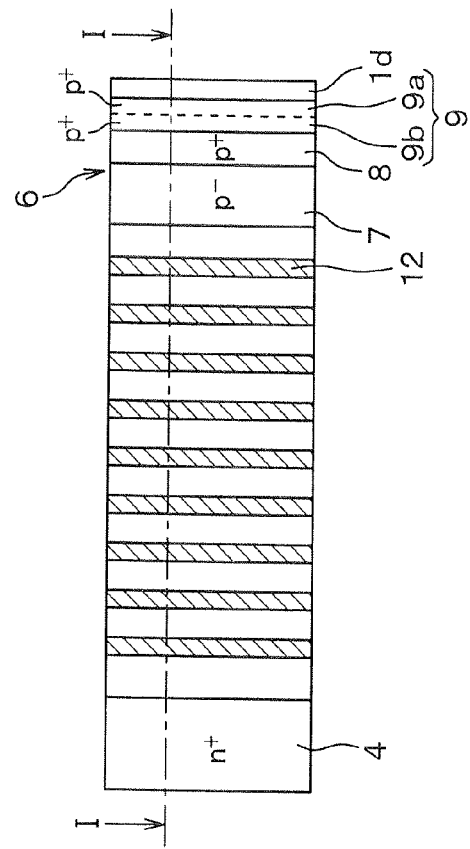
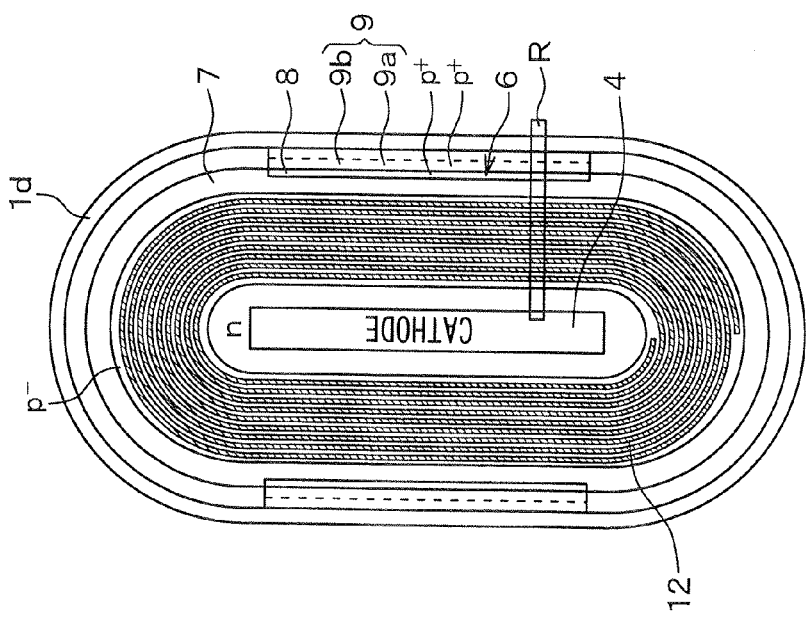
FIG. 2A
FIG. 2B (1) 32V (2) 82V (3) 179V (1) 50V (2) 105V (3) 188V (4) 203V (5) 225V (6) 252V (4) 210V (5) 230V (6) 251V

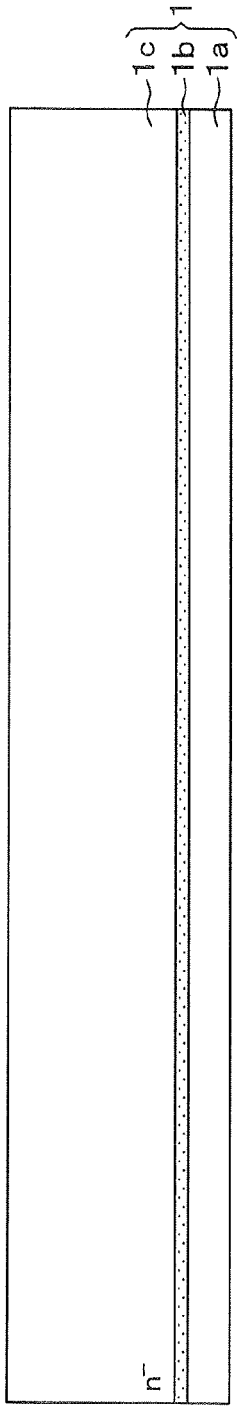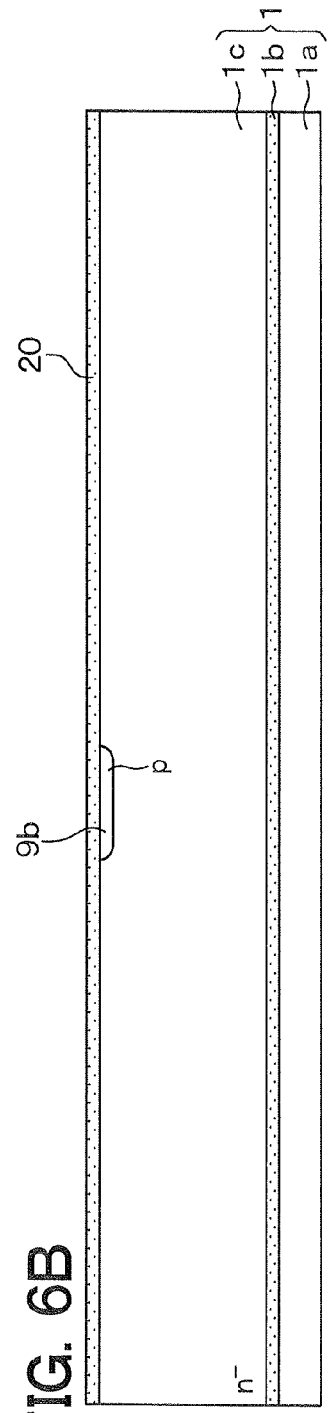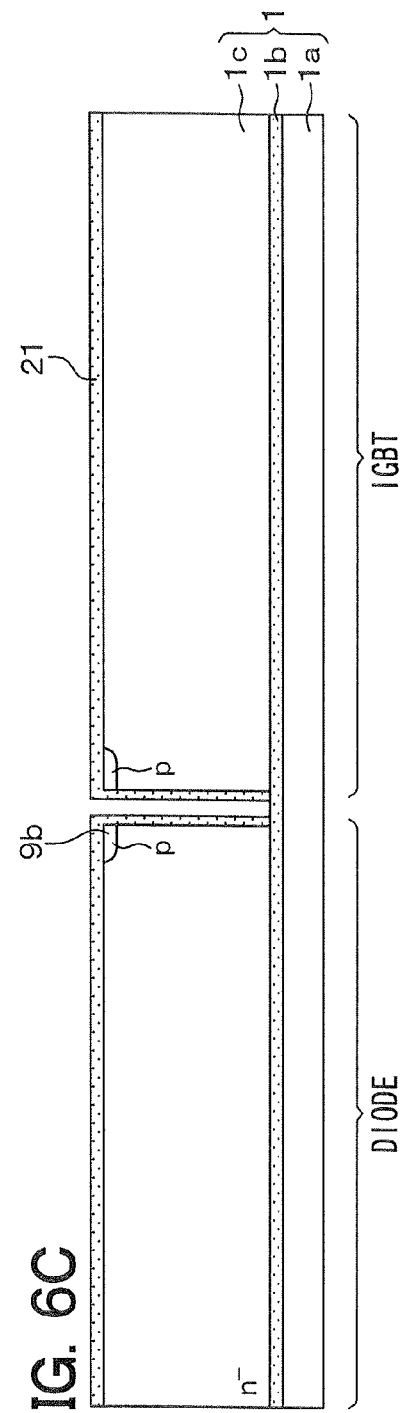

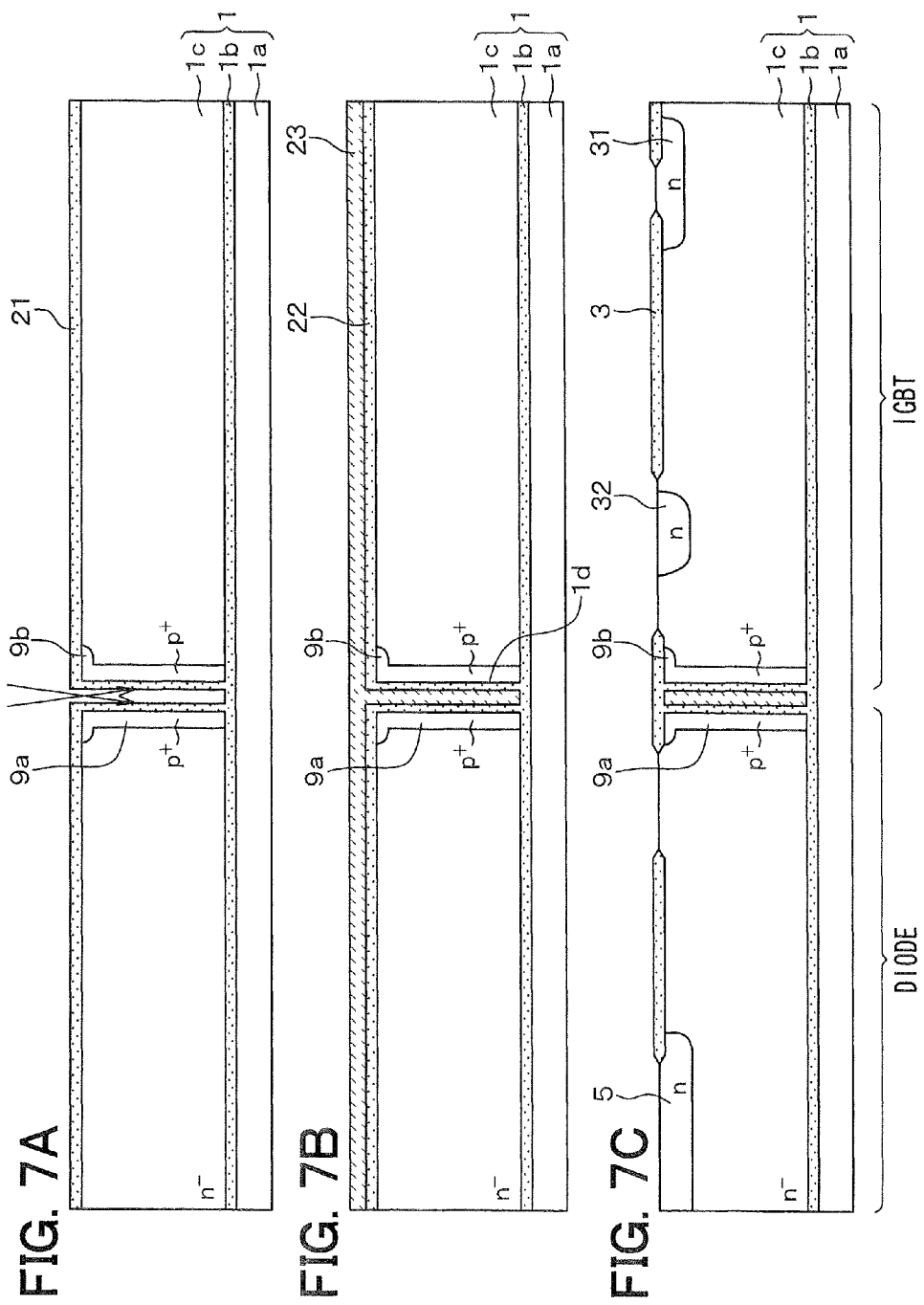

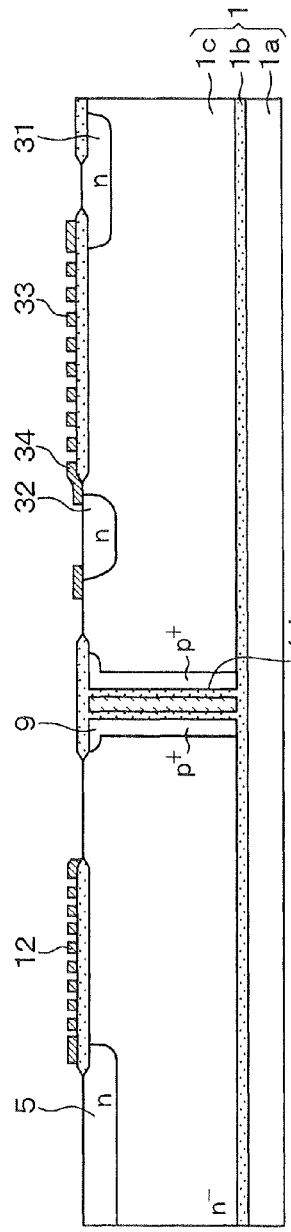
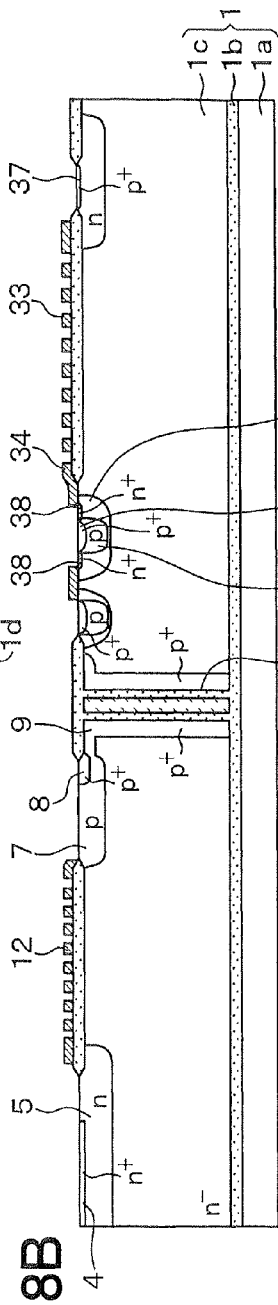
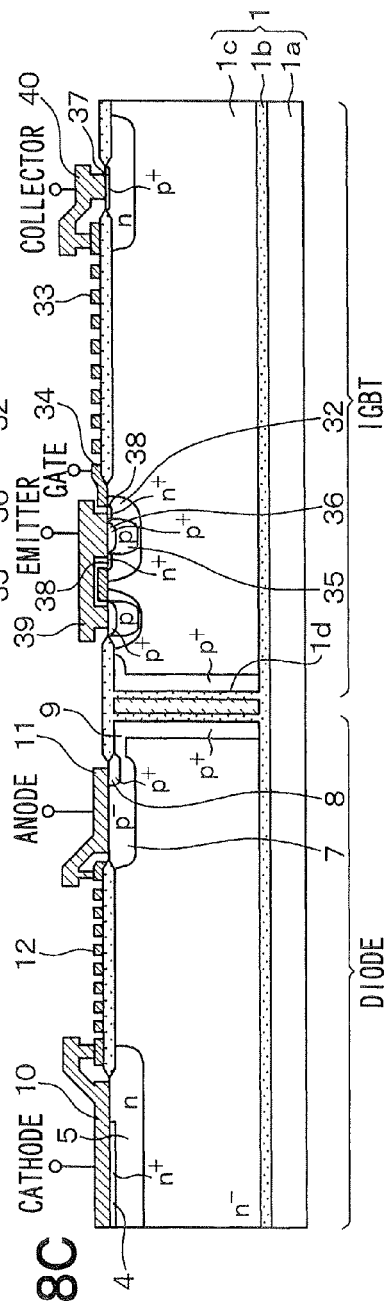
FIG. 8A
FIG. 8B
FIG. 8C

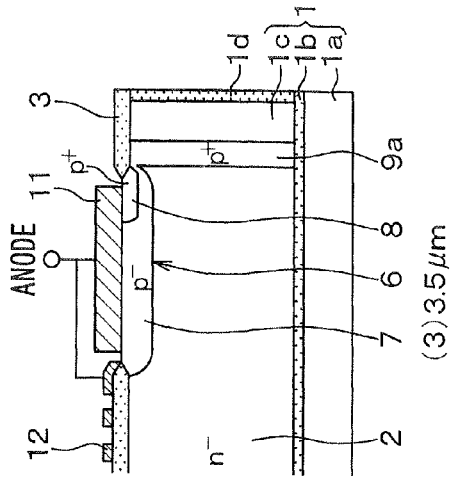
FIG. 27A
(1) 0 μm
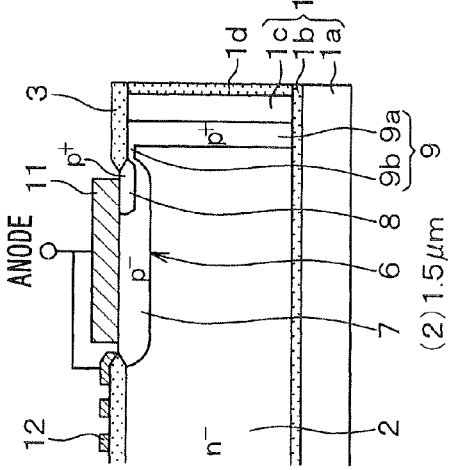
FIG. 27B
(2) 1.5 μm
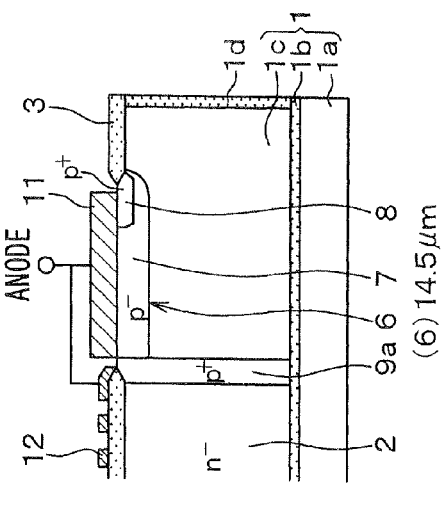
FIG. 27C
(3) 3.5 μm
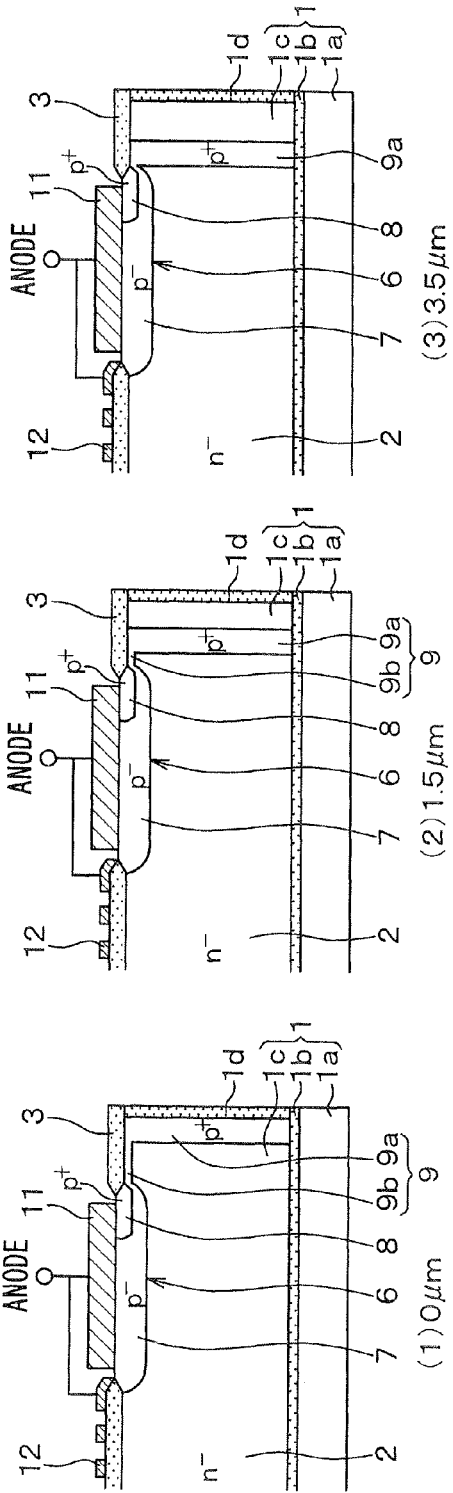
FIG. 27D
(4) 5.75 μm
FIG. 27E
(5) 9.5 μm
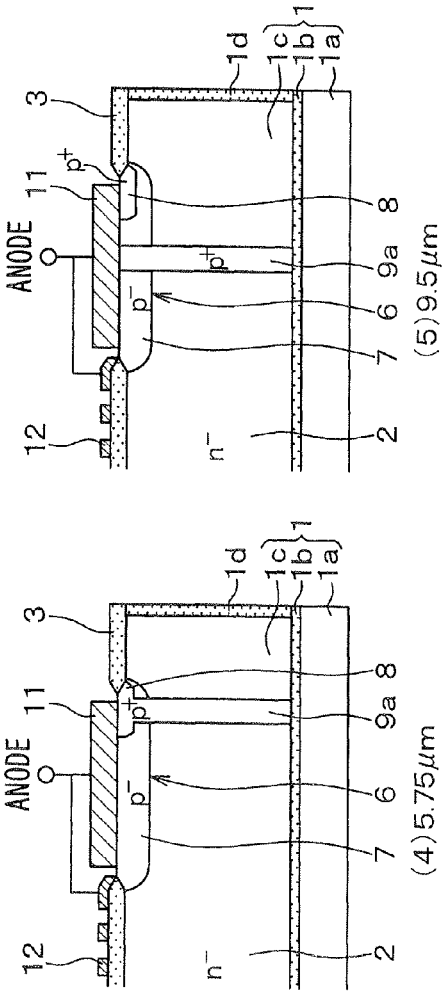
FIG. 27F
(6) 14.5 μm
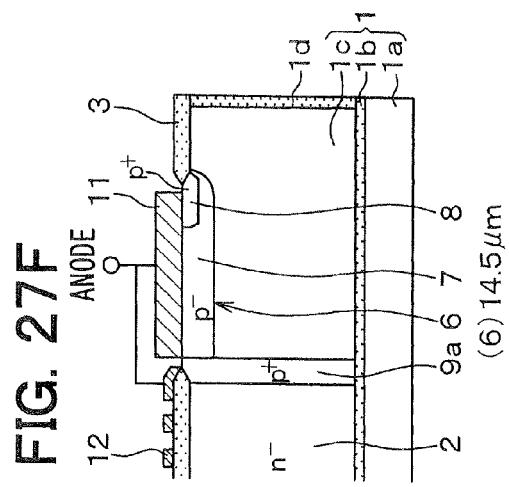

SEMICONDUCTOR DEVICE HAVING LATERAL DIODE

CROSS REFERENCE TO RELATED APPLICATION

This application is based on and claims priority to Japanese Patent Application No. 2010-175464 filed on Aug. 4, 2010 and No. 2011-118863 filed on May 27, 2011, the contents of which are incorporated herein by reference.

FIELD OF THE INVENTION

The present invention relates to a semiconductor device having a lateral diode.

BACKGROUND OF THE INVENTION

U.S. Pat. No. 5,982,015 corresponding to JP-A-11-233795 discloses a lateral diode used as a freewheeling diode (FWD) connected in parallel to a semiconductor switching element such as an insulated gate bipolar transistor (IGBT). The anode of the lateral diode has both ohmic contact and Schottky contact so that the accumulation of holes can be reduced. Accordingly, the reverse recovery charge Qrr is reduced so that the reverse recovery capability can be improved. That is, the Schottky contact reduces the electronic injection. Therefore, even when the hole injection can be reduced without reducing the amount of current. Thus, the reverse recovery charge Qrr is reduced so that the reverse recovery capability can be improved.

As described above, when the anode of the lateral diode has both ohmic contact and Schottky contact, the reverse recovery charge Qrr is reduced so that the reverse recovery capability can be improved. However, the avalanche capability cannot be improved. Therefore, it is likely that the avalanche breakdown occurs during a high speed switching operation.

SUMMARY OF THE INVENTION

In view of the above, it is an object of the present invention to provide a semiconductor device having a lateral diode with both improved reverse recovery capability and improved avalanche capability.

According to an aspect of the present invention, a semiconductor device having a lateral diode includes a semiconductor substrate including a first conductivity-type semiconductor layer, a first conductivity-type first semiconductor region located in the semiconductor layer, a first conductivity-type contact region having an impurity concentration greater than an impurity concentration of the first semiconductor region, a second semiconductor region located in the semiconductor layer and separated from the contact region, a first electrode electrically connected through the contact region to the first semiconductor region, and a second electrode electrically connected to the second semiconductor region. One of the first semiconductor region and the second semiconductor region is a cathode region. The other of the first semiconductor region and the second semiconductor region is an anode region. One of the first electrode and the second electrode, which is connected to the cathode region, is a cathode electrode of the lateral diode. The other of the first electrode and the second electrode, which is connected to the anode region, is an anode electrode of the lateral diode. The second semiconductor region includes a low impurity concentration portion, a high impurity concentration portion, and an extension portion. The low impurity concentration portion is in contact with the high impurity concentration portion and has an impurity concentration less than an impurity concentration of the high impurity concentration portion. The second electrode forms an ohmic contact with the high impurity concentration portion. The extension portion has an impurity concentration greater than the impurity concentration of the low impurity concentration portion and extends in a thickness direction of the semiconductor layer.

According to another aspect of the present invention, a semiconductor device having a lateral diode includes a semiconductor substrate including a supporting substrate, an insulation layer on the supporting substrate, and a first conductivity-type semiconductor layer on the insulation layer, an isolation structure extending from a surface of the semiconductor layer to the insulation layer, a first conductivity-type first semiconductor region located in the semiconductor layer isolated by the isolation structure, a first conductivity-type contact region having an impurity concentration greater than an impurity concentration of the first semiconductor region, a first electrode electrically connected to the contact region, and a second semiconductor region located in the first semiconductor region and separated from the contact region. The second semiconductor region includes a low impurity concentration portion and a high impurity concentration portion. The low impurity concentration portion is in contact with the high impurity concentration portion and has an impurity concentration less than an impurity concentration of the high impurity concentration portion. The semiconductor device further includes a second electrode electrically connected to the low impurity concentration portion and the high impurity concentration portion. The second electrode forms an ohmic contact with the high impurity concentration portion. The semiconductor device further includes a second conductivity-type extension portion located in the semiconductor layer and having an impurity concentration greater than the impurity concentration of the low impurity concentration portion. The extension portion extends in a thickness direction of the semiconductor layer and is located further away from the contact region than the low impurity concentration portion and the high impurity concentration portion.

BRIEF DESCRIPTION OF THE DRAWINGS

The above and other objects, features, and advantages will become more apparent from the following description and drawings in which like reference numerals depict like elements. In the drawings:

FIG. 2A is a diagram illustrating a top view of one cell of the lateral diode of FIG. 1, and FIG. 2B is an enlarged view taken within a region R in FIG. 2A;

FIGS. 6A-6C are diagrams illustrating manufacturing processes of the semiconductor device according to the first embodiment;

FIGS. 7A-7C are diagrams illustrating manufacturing processes following the manufacturing processes of FIGS. 6A-6C;

FIGS. 8A-8C are diagrams illustrating manufacturing processes following the manufacturing processes of FIGS. 7A-7C;

FIGS. 27A-27F are diagrams illustrating a semiconductor device in which an anode extension region is separated from a trench isolation structure $1d$ by 0 μm, 1.5 μm, 3.5 μm, 5.75 μm, 9.5 μm, and 14.5 μm, respectively;

DETAILED DESCRIPTION OF THE PREFERRED EMBODIMENTS (First Embodiment)

Figure 1:
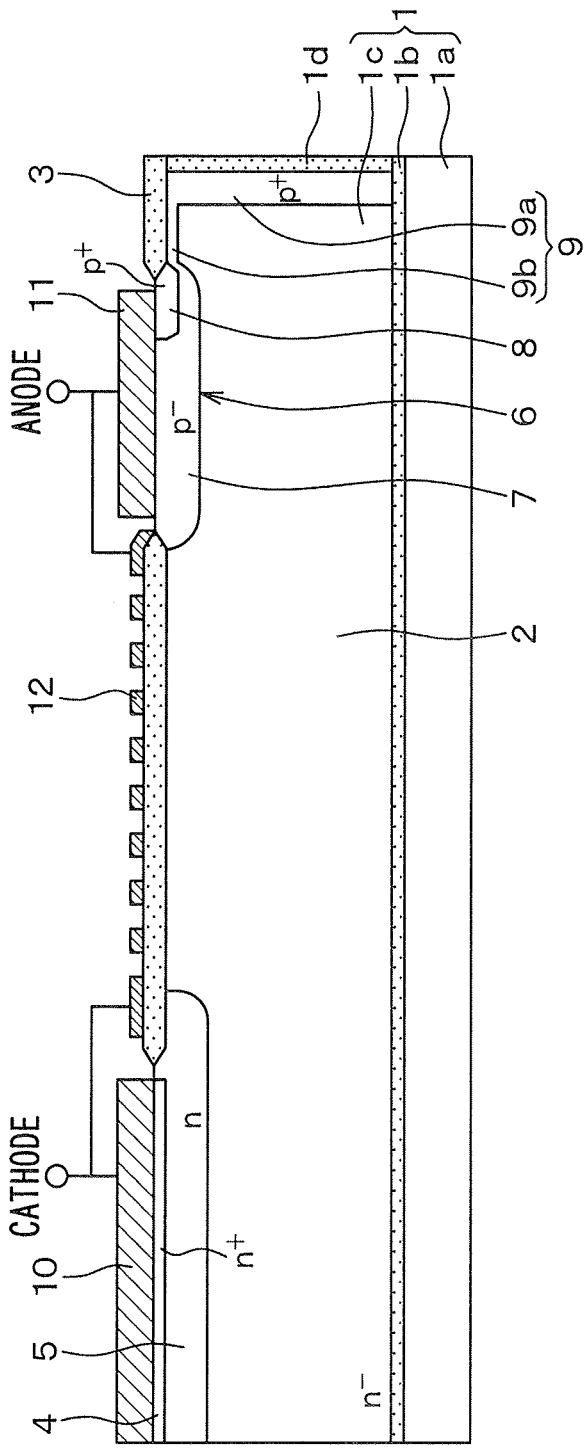
FIG. 1 is a diagram illustrating a cross-sectional view, taken along the line I-I in FIG. 2B, of a semiconductor device having a lateral diode according to a first embodiment of the present invention.

A semiconductor device having a lateral diode according to a first embodiment of the present invention is described below with reference to FIGS. 1, and 2A and 2B. FIG. 1 is a cross-sectional view of the semiconductor device taken along the line I-I in FIG. 2B. FIG. 2A is a top view of one cell of the lateral diode of the semiconductor device. FIG. 2B is an enlarged view taken within a region R in FIG. 2A.

According to the first embodiment, as shown in FIG. 1, the lateral diode is formed by using a semiconductor substrate 1 as a SOI substrate. The semiconductor substrate 1 includes a supporting substrate $1a$, a buried oxide (BOX) layer $1b$ on the supporting substrate $1a$, and an active layer $1c$ on the BOX layer $1b$. For example, the supporting substrate $1a$ can be a silicon substrate, and the active layer $1c$ can be a silicon layer. According to the first embodiment, the active layer $1c$ serves as an n$^-$-type cathode layer 2. Each part of the lateral diode is formed in the cathode layer 2.

The thickness of the BOX layer $1b$, and the thickness and the impurity concentration of the active layer $1c$ (i.e., the cathode layer 2) are not limited to specific values and can vary depending on the intended use of the semiconductor device. For example, in order to achieve high breakdown voltage, it is preferable that the thickness of the BOX layer $1b$ be 4 micrometers (μm) or more. For example, the active layer $1c$ can have an n-type impurity concentration of $7.0 \times 10^{14}$ cm$^{-3}$. A trench isolation structure $1d$ is formed in the semiconductor substrate 1 to surround the lateral diode so that the lateral diode can be isolated from other elements. For example, the trench isolation structure $1d$ has a trench extending from a surface of the active layer $1c$ to the BOX layer $1b$. The trench is filled with polysilicon through an insulation latter.

A LOCOS oxide layer 3 is formed on a surface of the cathode layer 2. The parts of the lateral diode are insulated from each other by the LOCOS oxide layer 3. An n+-type cathode contact region 4 is formed in the surface portion of the cathode layer 2 and exposed outside the LOCOS oxide layer 3. The cathode contact region 4 has a longitudinal direction parallel to a surface of the semiconductor substrate 1. The cathode contact region 4 is surrounded by an n-type buffer layer 5. The buffer layer 5 has an impurity concentration greater than that of the cathode layer 2. For example, the cathode contact region 4 can have an n-type impurity concentration of $1.0 \times 10^{20}$ cm$^{-3}$ and a depth of 0.2 μm. For example, the buffer layer 5 can have an n-type impurity concentration of $3.0 \times 10^{16}$ cm$^{-3}$ and a depth of 5 μm.

A p-type anode region 6 is formed in the surface portion of the cathode layer 2 and exposed outside the LOCOS oxide layer 3. The anode region 6 is arranged circularly around the cathode contact region 4 so that the cathode contact region 4 can be surrounded by the anode region 6. The anode region 6 has a p−-type low impurity concentration portion 7 and a p+-type high impurity concentration portion 8.

The low impurity concentration portion 7 is located closer to the cathode contact region 4 than the high impurity concentration portion 8. Further, a depth of the low impurity concentration portion 7 is greater than a depth of the high impurity concentration portion 8. According to the first embodiment, as shown in FIG. 2A, the low impurity concentration portion 7 has an ellipse shape when viewed from the top. Specifically, the low impurity concentration portion 7 has two straight parts extending in parallel to the cathode contact region 4 and two arc-shaped parts connecting ends of the straight parts. The low impurity concentration portion 7 has a p-type impurity concentration of $1.0 \times 10^{16}$ cm$^{-3}$ or less. For example, the low impurity concentration portion 7 can have the p-type impurity concentration of $1.0 \times 10^{16}$ cm$^{-3}$ and a thickness of 3.1 μm.

The high impurity concentration portion 8 is in contact with a surface of the low impurity concentration portion 7. According to the first embodiment, a side surface of the high impurity concentration portion 8 is covered with the low impurity concentration portion 7. As shown in FIG. 2A, the high impurity concentration portion 8 has a straight shape when viewed from the top. The high impurity concentration portion 8 is located on each side of the cathode contact region 4. Thus, the total number of the high impurity concentration portions 8 is two. According to the first embodiment, the high impurity concentration portion 8 is formed in a surface portion of the low impurity concentration portion 7 at a position furthest away from the cathode contact region 4. That is, the high impurity concentration portion 8 is located on the far side of the low impurity concentration portion 7 from the cathode contact region 4. The high impurity concentration portion 8 has a p-type impurity concentration of $1.0 \times 10^{19}$ cm$^{-3}$ or more. For example, the high impurity concentration portion 8 can have the p-type impurity concentration of $1.0 \times 10^{20}$ cm$^{-3}$ and a thickness of 0.55 μm.

A p+-type anode extension portion 9 is formed in the semiconductor substrate 1 and extends at least in a depth direction of the active layer 1c. The anode extension portion 9 is located further away from the cathode contact region 4 than the low impurity concentration portion 7 and the high impurity concentration portion 8 of the anode region 6. Specifically, the anode extension portion 9 is located outside the low impurity concentration portion 7 and the high impurity concentration portion 8 with respect to the cathode contact region 4. More specifically, the anode extension portion 9 is located between the trench isolation structure 1d and the low impurity concentration portion 7 and the high impurity concentration portion 8. According to the first embodiment, the anode extension portion 9 has a first portion 9a and a second portion 9b. The first portion 9a is in contact with a side surface of the trench isolation structure 1d. The second portion 9b connects the first portion 9a to the high impurity concentration portion 8. As shown in FIG. 2A, the anode extension portion 9 has a straight shape when viewed from the top. The anode extension portion 9 is located on each side of the cathode contact region 4. Thus, the total number of the anode extension regions 9 is two. For example, the anode extension portion 9 can have a p-type impurity concentration of $1.0 \times 10^{20}$ cm$^{-3}$. For example, the first portion 9a can have the same thickness as the active layer 1c and a width of 1 μm.

A cathode electrode 10 is formed on the surface of the cathode contact region 4 and electrically connected to the cathode contact region 4. An anode electrode 11 is formed on the surface of the anode region 6 and electrically connected to the anode region 6. The cathode electrode 10 forms ohmic contact with the cathode contact region 4. The cathode electrode 10 has the same straight shape as the cathode contact region 4 and is formed almost all over the surface of the cathode contact region 4. The anode electrode 11 has a straight shape and is located on each side of the cathode electrode 10. The anode electrode 11 forms Schottky or ohmic contact with the straight portion of the low impurity concentration portion 7 of the anode region 6. Further, the anode electrode 11 forms ohmic contact with the high impurity concentration portion 8 of the anode region 6. Thus, the anode electrode 11 is connected to both the low impurity concentration portion 7 and the high impurity concentration portion 8. According to the first embodiment, the anode electrode 11 is formed almost all over the straight portion of the anode region 6.

A resistor layer 12 is formed on the LOCOS oxide layer 3 between the cathode and the anode. For example, the resistor layer 12 can be made of doped polysilicon. The resistor layer 12 serves to maintain a uniform potential gradient between the cathode and the anode. Specifically, as shown in FIG. 2A, the resistor layer 12 has a spiral shape and is wound around the cathode electrode 10. The resistor layer 12 is electrically connected at one end to the cathode electrode 10 and at the other end to the anode electrode 11. The potential of the resistor layer 12 gradually decreases with the distance from the cathode electrode 10 due to a voltage drop caused by an internal resistance of the resistor layer 12. Thus, the potential gradient in the resistor layer 12 can be maintained uniform. Accordingly, the potential gradient in the cathode layer 2, which is located below the resistor layer 12 across the LOCOS oxide layer 3, can be maintained uniform. Thus, electric field concentration resulting from non-uniform potential gradient is reduced so that a breakdown voltage can be improved. Further, impact ionization is reduced so that an increase in turn-off switching time can be reduced.

In addition to the lateral diode, a semiconductor switching element such as a lateral IGBT is formed in the semiconductor substrate 1. The lateral diode is connected in parallel to the semiconductor switching element and used as a freewheeling diode.

As described above, according to the lateral diode of the first embodiment, while the anode electrode 11 forms Schottky or ohmic contact with the straight portion of the low impurity concentration portion 7 of the anode region 6, the anode electrode 11 forms ohmic contact with the high impurity concentration portion 8 of the anode region 6. Since the anode electrode 11 is electrically connected to the low impurity concentration portion 7, the amount of injected electrons becomes small so that the amount of injected holes can be reduced without reducing the amount of current. Thus, the reverse recovery charge Qrr is reduced so that the reverse recovery capability can be improved. Further, since the amount of injected holes is reduced, the lateral diode can operate fast without lifetime control.

Further, the anode extension portion 9 is located further away from the cathode contact region 4 than the low impurity concentration portion 7 and the high impurity concentration portion 8 of the anode region 6. In such an approach, the avalanche capability of the lateral diode can be improved. Specifically, the anode extension portion 9 has the first portion 9a extending in a vertical direction (i.e., thickness direction) of the semiconductor substrate 1. Thus, a depletion layer extends from the first portion 9a in a lateral direction (i.e., planar direction), perpendicular to the vertical direction, of the semiconductor substrate 1 to reduce electric field concentration. Therefore, the avalanche breakdown becomes less likely to occur so that the avalanche capability can be improved. Further, the anode extension portion 9 has the first portion 9a has the second portion 9b for connecting the first portion 9a to the anode electrode 11 through the high impurity concentration portion 8. Thus, holes are efficiently drawn from the first portion 9a to the anode electrode 11 through the second portion 9b and the high impurity concentration portion 8. Therefore, the lateral diode can perform fast switching operation so that recovery loss can be reduced.

Figure 3:
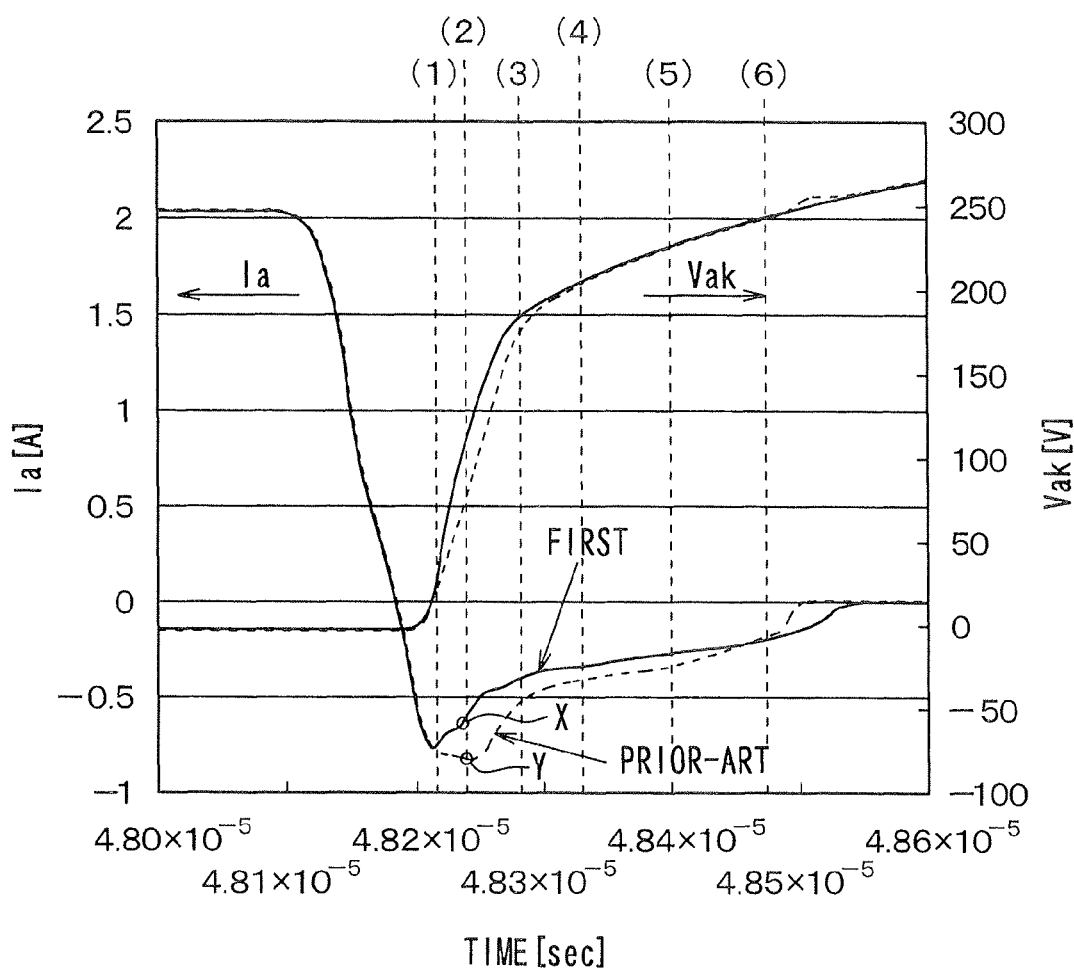
FIG. 3 is a diagram illustrating changes in an anode current and an anode-cathode voltage during switching operation in the first-embodiment lateral diode and a prior-art lateral diode.
Figure 4A:
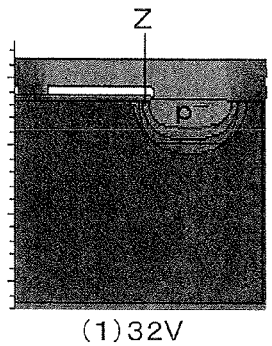
FIGS. 4A-4L are diagrams illustrating an electric field intensity distribution on an anode-side observed at times (1)-(6) in FIG. 3.
Figure 4B:
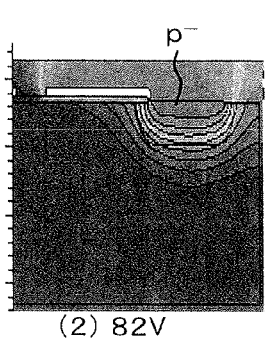
Figure 4C:
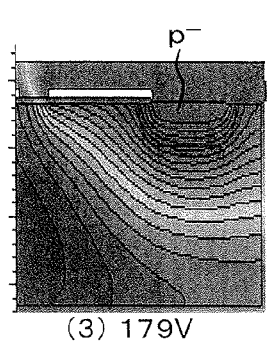
Figure 4D:
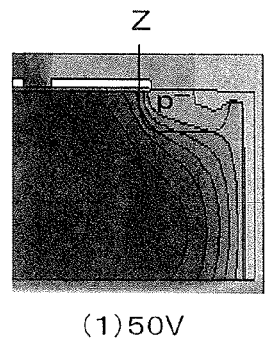
Figure 4E:
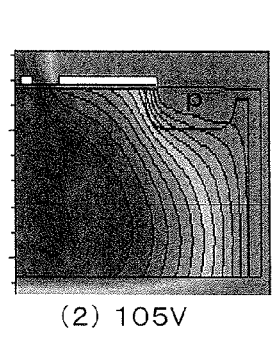
Figure 4F:
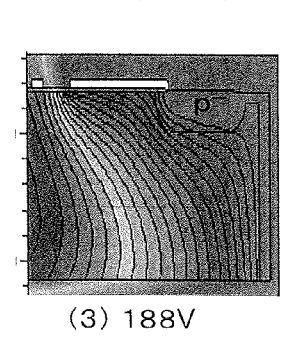
Figure 4G:
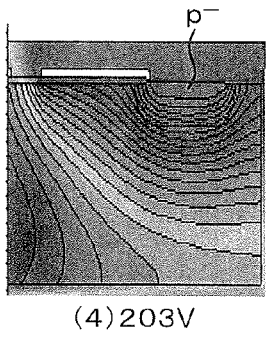
Figure 4H:
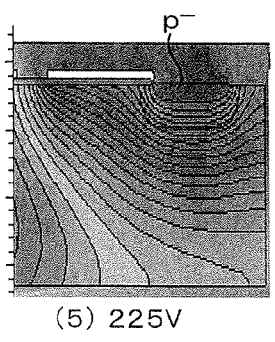
Figure 4I:
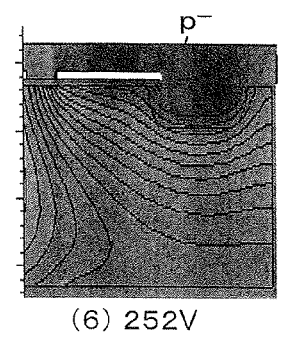
Figure 4J:
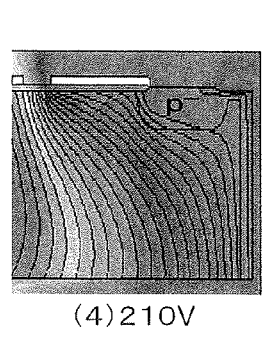
Figure 4K:
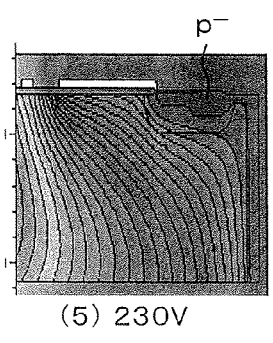
Figure 4L:
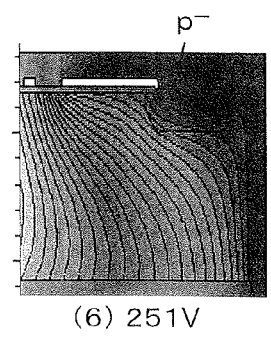
Figure 5:
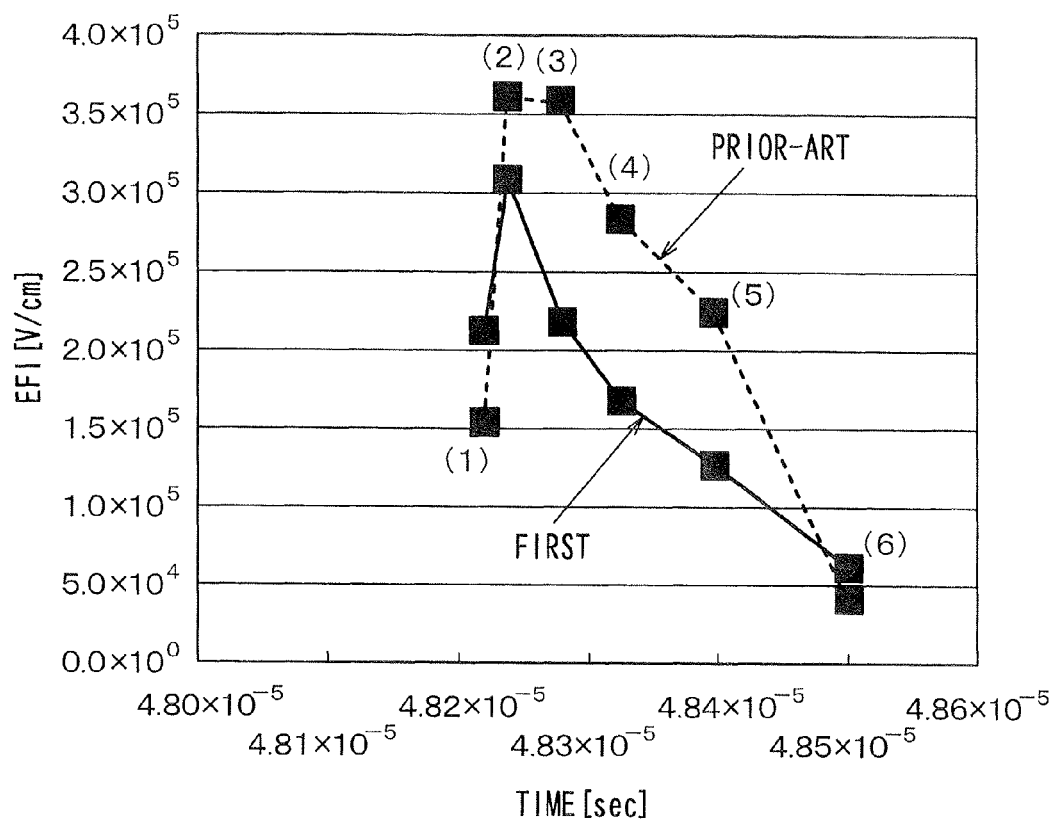
FIG. 5 is a diagram illustrating a change in an electric field intensity on the near side of a low impurity concentration portion from a cathode at the times (1)-(6)

FIG. 3, FIGS. 4A-4L, and FIG. and FIG. 5 shows a result of a simulation conducted by the present inventors to evaluate the effect of the first embodiment. FIG. 3 illustrates changes in an anode current Ia and an anode-cathode voltage Vak during a switching operation. In FIG. 3, a broken line represents a prior-art lateral diode having no anode extension portion 9, and a solid line represents the first-embodiment lateral diode having the anode extension portion 9. FIGS. 4A-4L illustrate the electric field intensity distribution on the anode-side observed at times (1)-(6) shown in FIG. 3. Specifically, FIGS. 4A, 4B, 4C, 4G, 4H, and 4I illustrate the electric field intensity distribution on the anode-side of the prior-art lateral diode at times (1)-(6), respectively. In contrast, FIGS. 4D, 4E, 4F, 43, 4K, and 4L illustrate the electric field intensity distribution on the anode-side of the first-embodiment lateral diode observed at the times (1)-(6), respectively. In FIGS. 4A-4L, the equipotential lines are spaced at intervals of 10 volts. FIG. 5 illustrates a change in the electric field intensity (EFI) on the near side (i.e., position Z in FIGS. 4A and 4D) of the low impurity concentration portion 7 from the cathode observed at the times (1)-(6). In FIG. 5, a broken line represents the prior-art lateral diode, and a solid line represents the first-embodiment lateral diode.

The recovery loss depends on the sum total of the amount of the anode current Ia flowing from when the anode current Ia becomes negative to when the anode current Ia becomes zero. In other words, the recovery loss depends on an area of the region where the anode current Ia is zero or less. The recovery loss increases with an increase in the area. As can be seen from FIG. 3, the amount of a reduction in the anode current Ia is smaller in the first-embodiment lateral diode than in the prior-art lateral diode. Accordingly, the area of the region where the anode current Ia is zero or less is smaller in the first-embodiment lateral diode than in the prior-art lateral diode. Therefore, the recovery loss becomes smaller in the first-embodiment lateral diode than in the prior-art lateral diode.

Further, since the prior-art lateral diode does not have the anode extension portion 9, the low impurity concentration portion 7 and the high impurity concentration portion 8 are surrounded by the equipotential lines, as shown in FIGS. 4A and 4B. Then, the equipotential lines extend below with time, as shown in FIG. 4C. Then, the equipotential lines reach the BOX layer 1b and extend in the lateral direction, as shown in FIGS. 4G, 4H, and 4I.

In contrast, since the first-embodiment lateral diode has the anode extension portion 9, the depletion layer can extend from the anode extension portion 9 so that depletion can be accelerated in the lateral direction. Thus, as shown in FIGS. 4D, 4E, 4F, 4J, 4K, and 4L, not only the low impurity concentration portion 7 and the high impurity concentration portion 8, but also the anode extension portion 9 are surrounded by the equipotential lines. In this way, the equipotential lines can extend in the lateral direction from the initial time (1).

Therefore, according to the first embodiment, local peak of the electric field intensity at an electric field concentration point is reduced. Thus, the avalanche breakdown is less likely to occur so that the avalanche capability can be improved.

The above effect of the first embodiment is clear from FIG. 5. As shown in FIG. 5, the electric field intensity on the near side of the low impurity concentration portion 7 from the cathode is smaller in the first-embodiment lateral diode than in the prior-art lateral diode. The above effect of the first embodiment is also clear from FIG. 3. As shown in FIG. 3, the anode current Ia has two local minimum values during reverse recovery operation. The second local minimum value depends on the avalanche capability. That is, as the second local minimum value is smaller, the avalanche capability is smaller. In FIG. 3, a point X indicates the second local minimum value in the first-embodiment lateral diode, and a point Y indicates the second local minimum value in the prior-art lateral diode. As can be seen by comparing the point X and the point Y, the second local minimum value is greater in the first-embodiment lateral diode than in the prior-art lateral diode. Therefore, the avalanche capability is greater in the first-embodiment lateral diode than in the prior-art lateral diode.

As described above, according to the first embodiment, the anode electrode 11 is electrically connected to the low impurity concentration portion 7 and the high impurity concentration portion 8, and the anode extension portion 9 is located further away from the cathode electrode 10 than the low impurity concentration portion 7 and the high impurity concentration portion 8. In such an approach, the amount of injected holes is reduced so that the reverse recovery capability can be improved, and also the avalanche capability can be improved.

By the way, in the prior-art lateral diode, the high impurity concentration portion 8 is surrounded by the low impurity concentration portion 7 to reduce hole injection from the high impurity concentration portion 8. Therefore, it is not obvious to those skilled in the art to add the anode extension portion 9 which can increase the hole injection.

The present inventors have conducted simulations and found out the following facts. Under a forward bias condition where carrier conduction depends on diffusion, an injection phenomenon depends on the $p^-/p^+$ anode structure in the anode region. That is, the anode extension portion 9, which is located in the back of the low impurity concentration portion 7, has no contribution to carrier conduction. On the other hand, under a recovery condition where carrier conduction depends on drift, the anode extension portion 9 acts as a $p^+$ anode layer of one-dimensional diode having a $p^+$-type right edge surface. At an initial stage of recovery, holes stored in a region from near the trench to below the anode are rapidly emitted into the anode extension portion 9 so that depletion can occur. Thus, depletion in the $n^-$-type drift layer (i.e., cathode layer 2) occurs rapidly, and the stored holes are emitted to the low impurity concentration portion 7. As a result, an increase in the electric field is reduced so that dynamic avalanche can be prevented.

Based on the above facts, the present inventors have conducted an experiment to evaluate the structure in which the anode extension portion 9 is located further away from the cathode electrode 10 than the low impurity concentration portion 7 and the high impurity concentration portion 8. A result of the experiment indicates that the anode extension portion 9 does not affect the hole injection. Since the anode extension portion 9 does not affect the hole injection, an increase in the reverse recovery charge Qrr and a reduction in the reverse recovery capability can be prevented.

Next, a method of manufacturing the semiconductor device having the lateral diode according to the first embodiment is described below with reference to FIGS. 6A-6C, 7A-7C, and 8A-8C. In the drawings, an IGBT is formed adjacent to the lateral diode.

Firstly, as shown in FIG. 6A, the semiconductor substrate 1 is prepared. For example, a silicon substrate for the active layer 1c is bonded on the supporting substrate 1a through the BOX layer 1b, and then the silicon substrate is thinned to a predetermined thickness corresponding to the active layer 1c. In this way, the semiconductor substrate 1 can be prepared.

Then, as shown in FIG. 6B, a cap layer 20 for ion injection is formed on the surface of the active layer 1c, and a mask (not shown) having an opening at a position corresponding to the second portion 9b to be formed is placed on the cap layer 20. Then, p-type impurities are doped through the mask into the active layer 1c by ion implantation to form the second portion 9b. Then, the mask and the cap layer 20 are removed.

Then, as shown in FIG. 6C, a mask (not shown) having an opening at a position corresponding to the trench isolation structure 1d to be formed is formed on the active layer 1c. Then, a trench is etched in the active layer 1c by using the mask. Then, after the mask is removed, a cap layer 21 is formed on the active layer 1c and inside the trench.

Then, as shown in FIG. 7A, a mask having an opening at a position corresponding to the trench isolation structure 1d to be formed is placed on the cap layer 21, and p-type impurities are doped through the mask, for example, by oblique ion implantation, to form the first portion 9a. Then, the mask and the cap layer 21 are removed.

Then, as shown in FIG. 7B, a thermal oxidation layer 22 is formed by thermal oxidation on the active layer 1c and the inside the trench. Then, a polysilicon layer 23 is formed on the thermal oxidation layer 22 to fill the trench. Then, for example, an etch-back process is performed so that the polysilicon layer 23 can remain only inside the trench. Thus, the trench isolation structure 1d.

As shown in FIG. 7C, an n-type diffusion layer 1c formed at a predetermined position in the active layer 1c. According to the first embodiment, the diffusion layer includes the n-type buffer layer 5, an n-type buffer layer 31, and an n-type burrier layer 32. The buffer layer 5 is located in a diode area, where the lateral diode is formed. The buffer layer 31 and the burrier layer 32 are located in an IGBT area, where the IGBT is formed. Then, the LOCOS oxide layer 3 is formed by a well-known LOCOS oxidation process.

Then, as shown in FIG. 8A, a doped polysilicon layer 1c formed on the surface of the semiconductor substrate 1, after gate oxidation is performed. Then, the resistor layer 12 is formed by patterning the doped polysilicon layer in the diode area. Likewise, a resistor layer 33 and a gate electrode 34 are formed by patterning the doped polysilicon layer in the IGBT area.

Then, as shown in FIG. 8B, a process of forming a mask and a process of performing ion implantation through the mask are repeatedly performed to form a diffusion layer. Thus, the cathode contact region 4, the low impurity concentration portion 7, and the high impurity concentration portion 8 are formed in the diode area, and a p-type contact layer 35, a p-type body layer 36, a $p^+$-type collector region 37, and an $n^+$-type emitter region 38 are formed in the IGBT area.

Then, an interlayer dielectric film (not shown) is formed, and a contact hole is formed in the interlayer dielectric film. Then, a conductor layer 1c formed on the interlayer dielectric film to fill the contact hole. Then, as shown in FIG. 8C, the cathode electrode 10 and the anode electrode 11 are formed by patterning the conductor layer in the diode area. Likewise, an emitter electrode 39 and a collector electrode 39 are formed by patterning the conductor layer in the IGBT area.

In this way, the lateral diode and the lateral IGBT are formed in the same semiconductor substrate 1. Another type of semiconductor switching element such as a MOSFET can be formed in the same semiconductor substrate 1 as the lateral diode. However, when the lateral diode is combined with the MOSFET, the anode current Ia has three local minimum values during reverse recovery operation. Therefore, the recovery loss becomes larger when the lateral diode is combined with the MOSFET than when the lateral diode is combined with the IGBT.

(Second Embodiment)

A second embodiment of the present invention is described below with reference to FIG. 9. A difference between the first and second embodiments is the structure of the anode extension portion 9.

Figure 9:
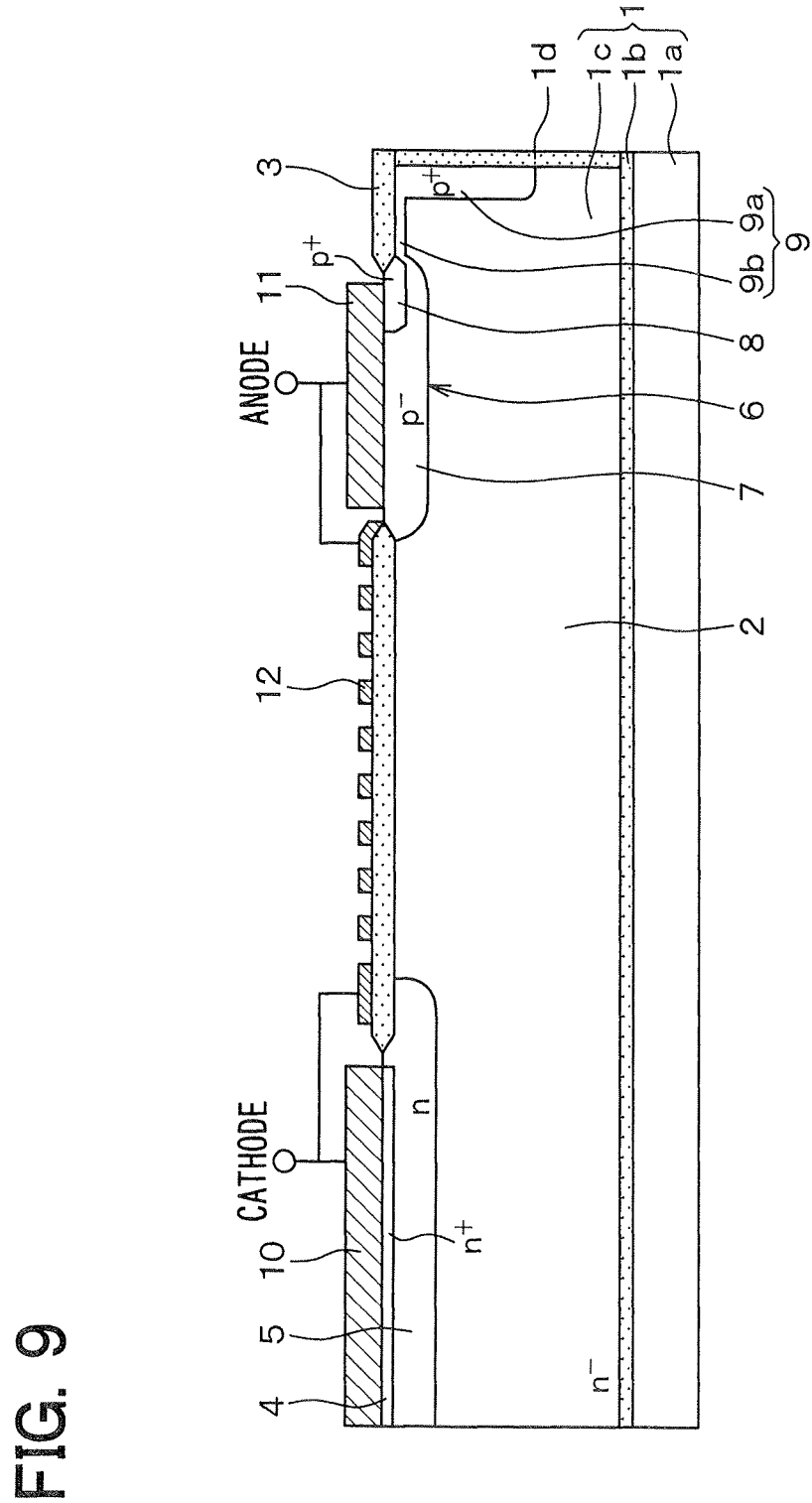
FIG. 9 is a diagram illustrating a cross-sectional view of a semiconductor device having a lateral diode according to a second embodiment of the present invention.

FIG. 9 is a diagram illustrating a cross-sectional view of a semiconductor device having a lateral diode according the second embodiment. As shown in FIG. 9, according to the second embodiment, the thickness of the first portion 9a of the anode extension portion 9 is less than the active layer 1c. Specifically, the first portion 9a extends from the surface of the active layer 1c and is terminated inside the active layer 1c without reaching the BOX layer 1b. Thus, about an upper half of the side surface of the trench isolation structure 1d is covered with the first portion 9a, but about a lower half of the side surface of the trench isolation structure 1d is not covered with the first portion 9a. About the lower half of the trench isolation structure 1d is in contact with the cathode layer 2.

Even in such a structure as shown in FIG. 9, the depletion layer can extend from the anode extension portion 9 including the first portion 9a and the second portion 9b, so that depletion can be accelerated in the lateral direction. Since the first portion 9a does not reach the BOX layer 1b, the depletion layer 1c less likely to extend to a lower portion of the active layer 1c. However, almost the same affect as the first embodiment can be obtained.

The semiconductor device according to the second embodiment can be manufactured by almost the same method as the semiconductor device according to the first embodiment. However, when the oblique ion implantation of p-type impurities is performed to form the first portion 9a, an angle of the oblique ion implantation needs to be adjusted so that the thickness of the first portion 9a can be less than the thickness of the active layer 1c.

(Third Embodiment)

A third embodiment of the present invention is described below with reference to FIG. 10. A difference between the first and third embodiments is the structure of the anode extension portion 9.

Figure 10:
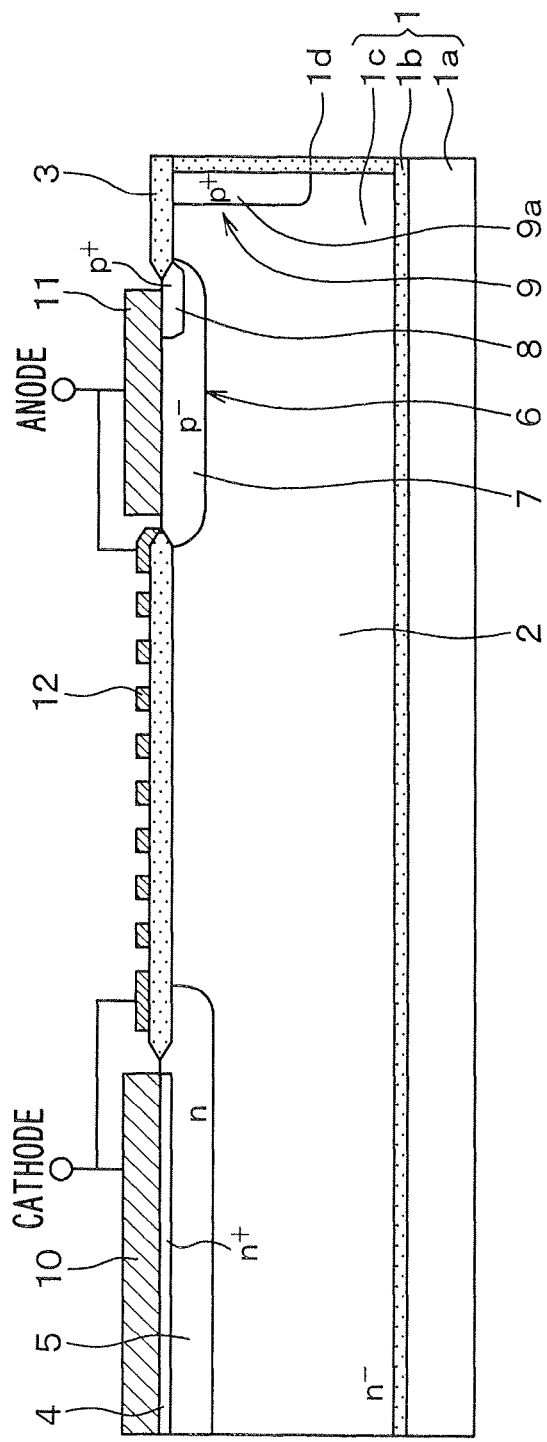
FIG. 10 is a diagram illustrating a cross-sectional view of a semiconductor device having a lateral diode according to a third embodiment of the present invention.

FIG. 10 is a diagram illustrating a cross-sectional view of a semiconductor device having a lateral diode according the third embodiment. As shown in FIG. 10, according to the third embodiment, the thickness of the first portion 9a of the anode extension portion 9 is less than the active layer 1c. Specifically, like the second embodiment, the first portion 9a extends from the surface of the active layer 1c and is terminated inside the active layer 1c without reaching the BOX layer 1b.

Further, according to the third embodiment, the anode extension portion 9 has no second portion 9b. Therefore, the first portion 9a is separated from the anode region 6.

Even in such a structure as shown in FIG. 10, the depletion layer can extend from the anode extension portion 9 including the first portion 9a, so that depletion can be accelerated in the lateral direction. Since the anode extension portion 9 has no second portion 9b, holes cannot be drawn by using a path passing the first portion 9a, the second portion 9b, the high impurity concentration portion 8, and the anode electrode 11. Therefore, from the standpoint of hole drawing efficiency, it is preferable that the anode extension portion 9 have the second portion 9b.

The semiconductor device according to the third embodiment can be manufactured by almost the same method as the semiconductor device according to the second embodiment. However, since the anode extension portion 9 has no second portion 9b, there is no need to perform the process of forming the second portion 9b.

(Fourth Embodiment)

A fourth embodiment of the present invention is described below with reference to FIG. 11. A difference between the first and fourth embodiments is the structure of the anode extension portion 9.

Figure 11:
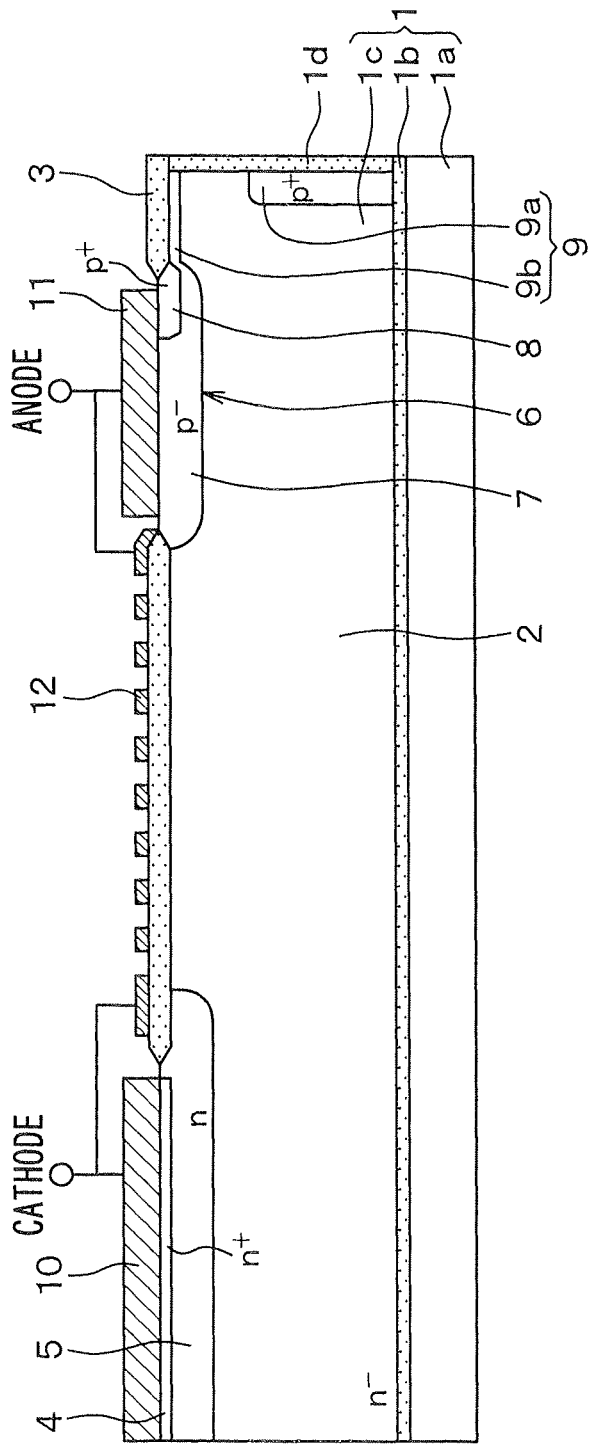
FIG. 11 is a diagram illustrating a cross-sectional view of a semiconductor device having a lateral diode according to a fourth embodiment of the present invention.

FIG. 11 is a diagram illustrating a cross-sectional view of a semiconductor device having a lateral diode according the fourth embodiment. As shown in FIG. 11, according to the fourth embodiment, the thickness of the first portion 9a of the anode extension portion 9 is less than the active layer 1c. Specifically, the first portion 9a extends from the BOX layer 1b on the bottom of the active layer 1c and is terminated inside the active layer 1c. Thus, about the lower half of the side surface of the trench isolation structure 1d is covered with the first portion 9a, but about the upper half of the side surface of the trench isolation structure 1d is not covered with the first portion 9a. About the upper half of the trench isolation structure 1d is in contact with the cathode layer 2.

Even in such a structure as shown in FIG. 11, the depletion layer can extend from the anode extension portion 9 including the first portion 9a and the second portion 9b, so that depletion can be accelerated in the lateral direction. Since the first portion 9a does not reach the surface of the active layer 1c, the depletion layer 1c less likely to extend to an upper portion of the active layer 1c. However, almost the same affect as the first embodiment can be obtained.

The semiconductor device according to the fourth embodiment can be manufactured by almost the same method as the semiconductor device according to the first embodiment. However, since the first portion 9a needs to be formed only in a deep position in the active layer 1c, the first portion 9a is formed by a method other than the oblique ion implantation. For example, p-type impurities are implanted into a surface of the silicon substrate for the active layer 1c, and then bonding the surface of the silicon substrate to the supporting substrate 1a through the BOX layer 1b. Thus, the first portion 9a is formed only in a deep position in the active layer 1c. For another example, before the trench isolation structure 1d is formed in the semiconductor substrate 1, p-type impurities are implanted into the semiconductor substrate 1 with high energy.

(Fifth Embodiment)

A fifth embodiment of the present invention is described below with reference to FIG. 12. A difference between the first and fifth embodiments is the structure of the anode extension portion 9.

Figure 12:
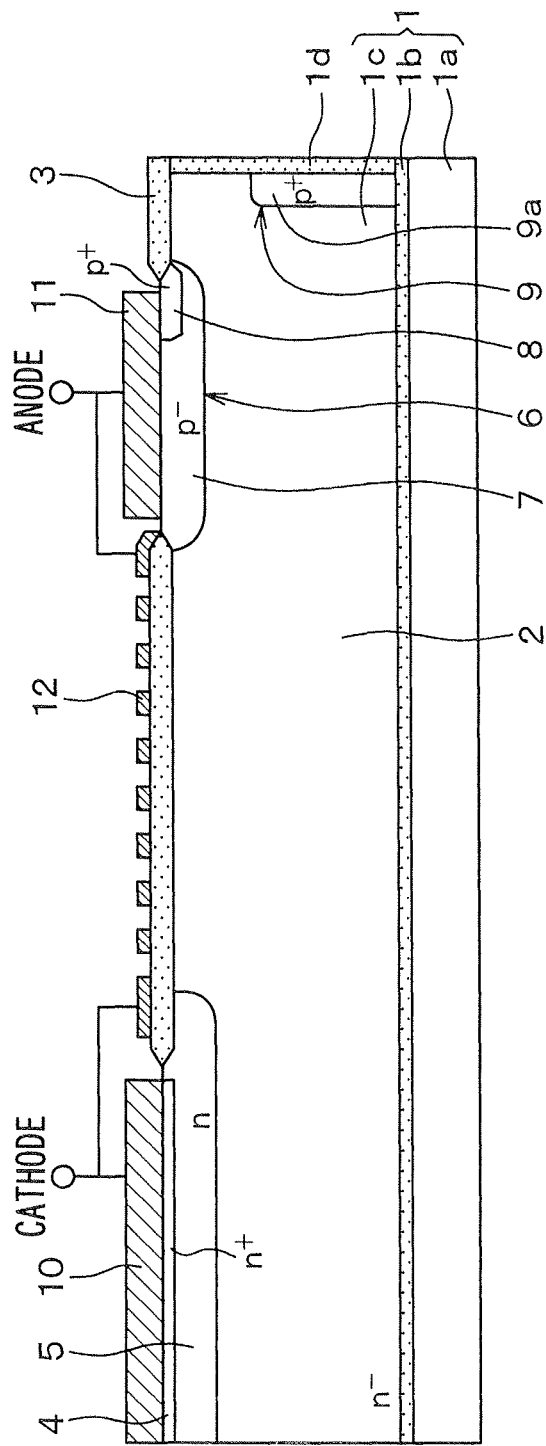
FIG. 12 is a diagram illustrating a cross-sectional view of a semiconductor device having a lateral diode according to a fifth embodiment of the present invention.

FIG. 12 is a diagram illustrating a cross-sectional view of a semiconductor device having a lateral diode according the fifth embodiment. As shown in FIG. 12, according to the fifth embodiment, the thickness of the first portion 9a of the anode extension portion 9 is less than the active layer 1c. Specifically, like the fourth embodiment, the first portion 9a extends from the BOX layer 1b on the bottom of the active layer 1c and is terminated inside the active layer 1c. Further, according to the fifth embodiment, the anode extension portion 9 has no second portion 9b. Therefore, the first portion 9a is separated from the anode region 6.

Even in such a structure as shown in FIG. 12, the depletion layer can extend from the anode extension portion 9 including the first portion 9a, so that depletion can be accelerated in the lateral direction. Since the anode extension portion 9 has no second portion 9b, holes cannot be drawn by using a path passing the first portion 9a, the second portion 9b, the high impurity concentration portion 8, and the anode electrode 11. Therefore, from the standpoint of hole drawing efficiency, it is preferable that the anode extension portion 9 have the second portion 9b.

The semiconductor device according to the fifth embodiment can be manufactured by almost the same method as the semiconductor device according to the fourth embodiment. However, since the anode extension portion 9 has no second portion 9b, there is no need to perform the process of forming the second portion 9b.

(Effect of the Second Through Fifth Embodiments)

Figure 13:
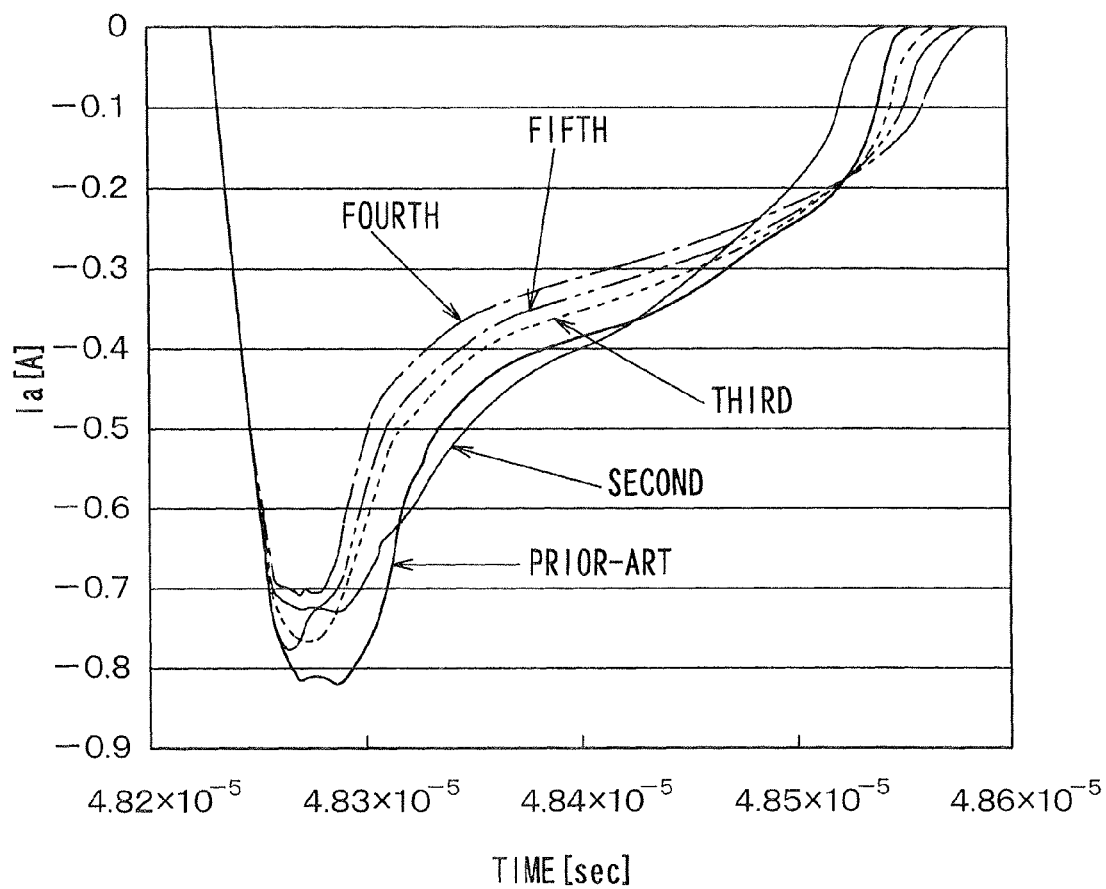
FIG. 13 is a diagram illustrating changes in the anode current and the anode-cathode voltage during switching operation in the second through fifth-embodiment lateral diodes and the prior-art lateral diode.

FIG. 13 illustrates changes in the anode current Ia and the anode-cathode voltage Vak during switching operation in the second-embodiment lateral diode, the third-embodiment lateral diode, the fourth-embodiment lateral diode, the fifth-embodiment lateral diode, and the prior-art lateral diode having no anode extension portion 9.

As can be seen from FIG. 13, the recovery loss in the lateral diode of each of the second through fifth embodiments is smaller than that of the prior-art lateral diode.

(Sixth Embodiment)

A sixth embodiment of the present invention is described below with reference to FIGS. 14 and 15. A difference between the first and sixth embodiments is the structure of the high impurity concentration portion 8.

Figure 14:
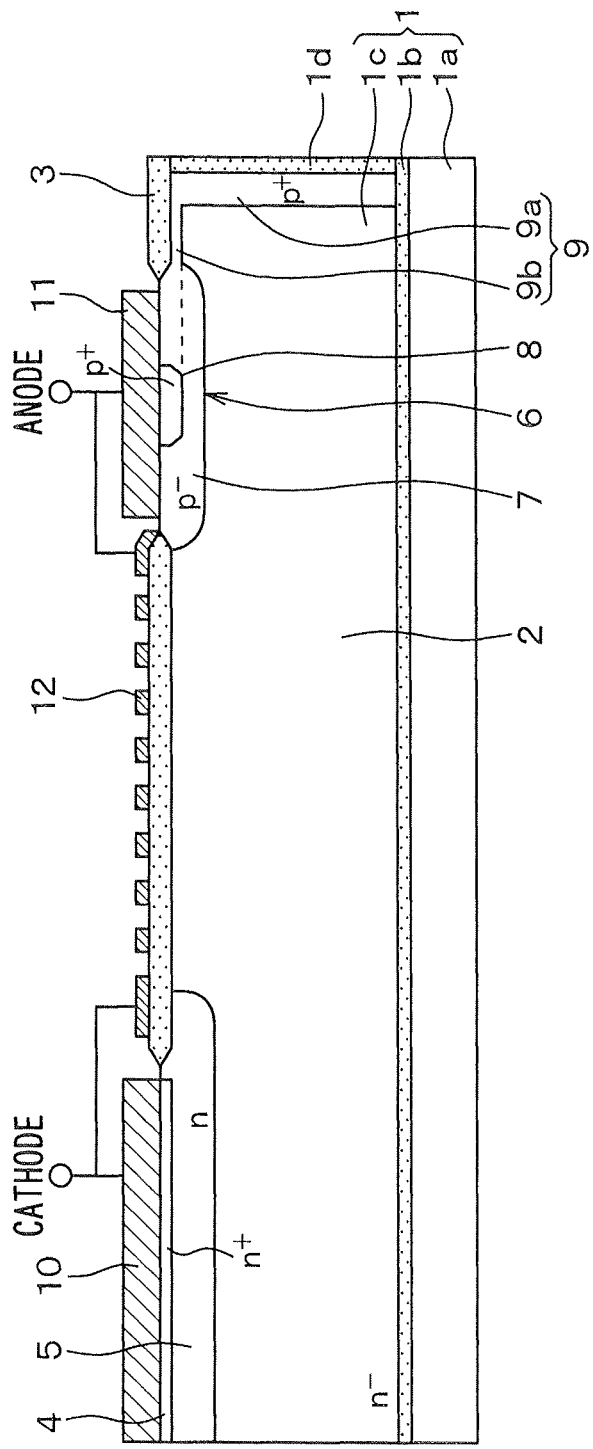
FIG. 14 is a diagram illustrating a cross-sectional view of a semiconductor device having a lateral diode according to a sixth embodiment of the present invention.
Figure 15:
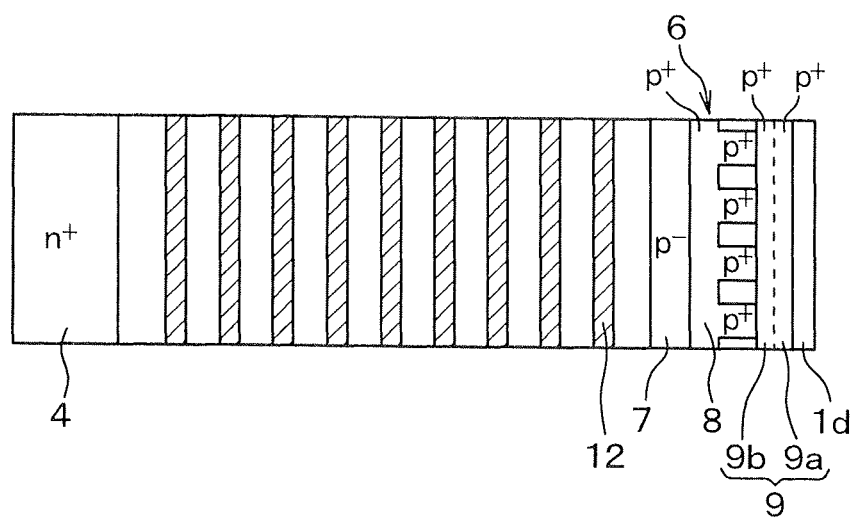
FIG. 15 is diagram illustrating an enlarged partial top view of the semiconductor device of FIG. 14.

FIG. 14 is a diagram illustrating a cross-sectional view of a semiconductor device having a lateral diode according the sixth embodiment. FIG. 15 is diagram corresponding to FIG. 2B and illustrating an enlarged partial top view of the lateral diode of FIG. 14.

According to the first embodiment, the high impurity concentration portion 8 is located on the far side of the low impurity concentration portion 7 from the cathode contact region 4. In contrast, as shown in FIG. 15, according to the sixth embodiment, the high impurity concentration portion 8 is located in the center of the low impurity concentration portion 7. Specifically, a width direction of the low impurity concentration portion 7 is perpendicular to the longitudinal direction of the cathode contact region 4, and the high impurity concentration portion 8 is located in the center of the low impurity concentration portion 7 in the width direction of the low impurity concentration portion 7.

Basically, the high impurity concentration portion 8 has a straight shape. Specifically, as shown in FIG. 15, the high impurity concentration portion 8 has a straight portion and projections extending perpendicularly from the straight portion and connected to the second portion 9b. For example, the projections can be arranged at regular intervals.

As described above, according to the sixth embodiment, the straight portion of the high impurity concentration portion 8 is located in the center of the low impurity concentration portion 7, and the projections of the high impurity concentration portion 8 extend from the straight portion and are connected to the second portion 9b. In such an approach, the same effect as the first embodiment can be obtained.

(Seventh Embodiment)

A seventh embodiment of the present invention is described below with reference to FIGS. 16 and 17. A difference between the first and seventh embodiments is the structure of the high impurity concentration portion 8.

Figure 16:
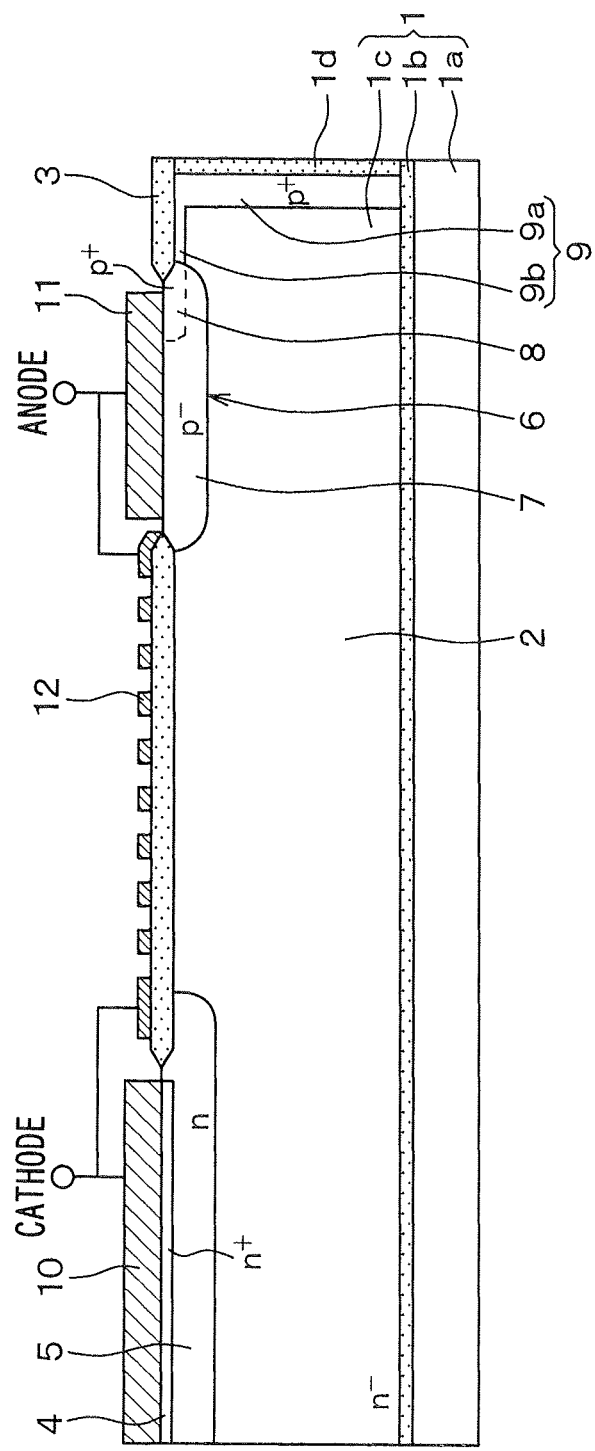
FIG. 16 is a diagram illustrating a cross-sectional view of a semiconductor device having a lateral diode according to a seventh embodiment of the present invention.
Figure 17:
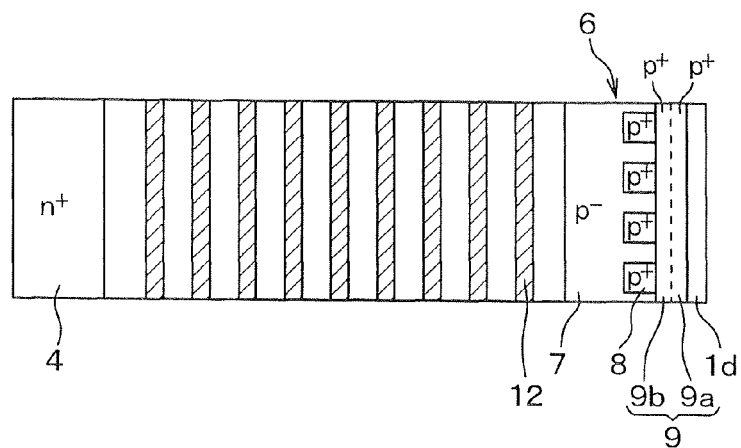
FIG. 17 is diagram illustrating an enlarged partial top view of the semiconductor device of FIG. 16.

FIG. 16 is a diagram illustrating a cross-sectional view of a semiconductor device having a lateral diode according the seventh embodiment. FIG. 17 is diagram corresponding to FIG. 2B and illustrating an enlarged partial top view of the lateral diode of FIG. 16.

Like the first embodiment, according to the seventh embodiment, the high impurity concentration portion 8 is located on the far side of the low impurity concentration portion 7 from the cathode contact region 4. Unlike the first embodiment, the high impurity concentration portion 8 is divided into multiple portions. The divided portions of the high impurity concentration portion 8 are arranged at regular intervals and connected to the second portion 9b. Further, the divided portions of the high impurity concentration portion 8 are electrically connected to the anode electrode 11.

As described above, according to the seventh embodiment, the high impurity concentration portion 8 is divided into multiple portions that are arranged at regular intervals and connected to the second portion 9b.

In such an approach, the same effect as the first embodiment can be obtained.

(Effect of the Sixth and Seventh Embodiments)

Figure 18:
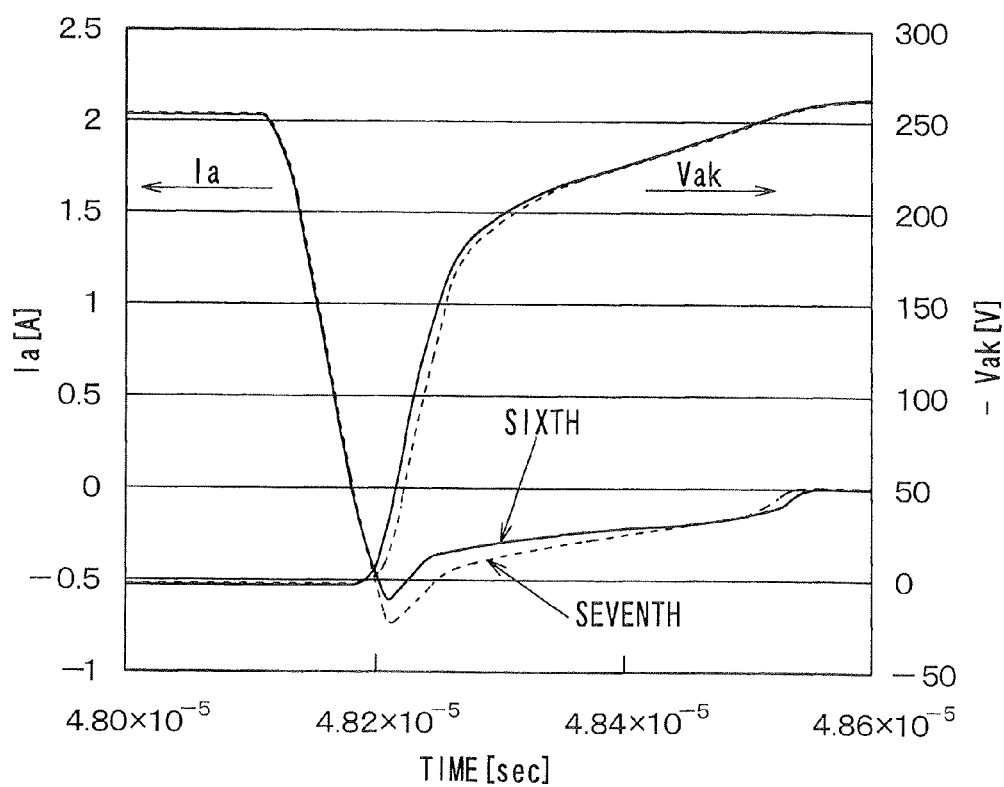
FIG. 18 is a diagram illustrating changes in the anode current and the anode-cathode voltage during switching operation in the sixth and seventh-embodiment lateral diodes and the prior-art lateral diode.

FIG. 18 illustrates changes in the anode current Ia and the anode-cathode voltage Vak during switching operation in the sixth-embodiment lateral diode and the seventh-embodiment lateral diode.

As can be seen from FIG. 3 and FIG. 18, the recovery loss in the lateral diode of each of the sixth and seventh embodiments is smaller than that of the prior-art lateral diode. Further, FIG. 18 shows that the recovery loss in the sixth-embodiment lateral diode is smaller than the recovery loss in the seventh-embodiment lateral diode. Specifically, in the sixth-embodiment lateral diode, the reverse recovery charge Qrr is 96.8nC, and a reverse recovery current Irr is 0.56 A. In contrast, in the seventh-embodiment lateral diode, the reverse recovery charge Qrr is 114.8nc, and a reverse recovery current Irr is 0.75 A.

(Eighth Embodiment)

Figure 19:
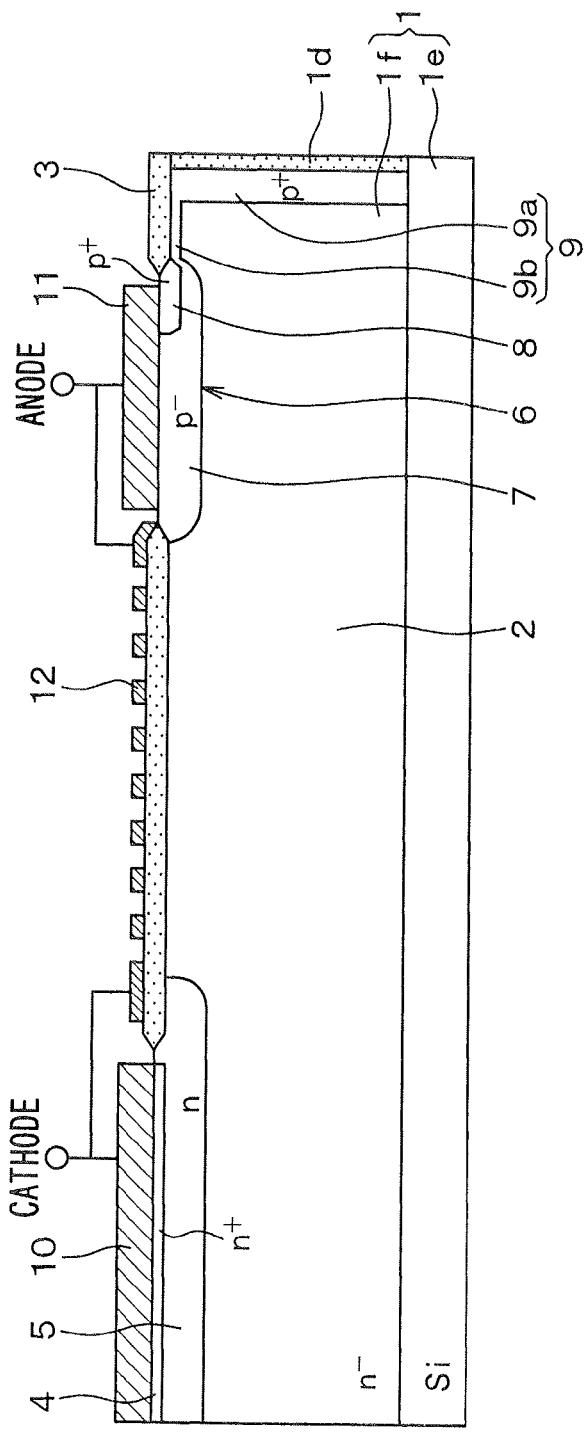
FIG. 19 is a diagram illustrating a cross-sectional view of a semiconductor device having a lateral diode according to an eighth embodiment of the present invention.

An eighth embodiment of the present invention is described below with reference to FIG. 19. A difference between the first and seventh embodiments is the structure of the semiconductor substrate 1.

According to the first embodiment, the semiconductor substrate 1 is a SOI substrate. However, the semiconductor substrate 1 is not limited to a SOI substrate. FIG. 19 is a diagram illustrating a cross-sectional view of a semiconductor device having a lateral diode according the eighth embodiment. As shown in FIG. 19, according to the eighth embodiment, the semiconductor substrate 1 is an epitaxial wafer. Specifically, the semiconductor substrate 1 includes a silicon substrate 1e and an epitaxial layer 1f, as a semiconductor layer, grown on a surface of the silicon substrate 1e. The silicon substrate 1e is an n-type or a p-type substrate and has a low impurity concentration of, for example, $1.0 \times 10^{13}$ cm$^{-3}$. The epitaxial layer 1f is an n$^-$-type impurity layer and has an n-type low impurity concentration of, for example, $7.0 \times 10^{14}$ cm$^{-3}$. The trench isolation structure 1d is formed in the semiconductor substrate 1. The trench isolation structure 1d includes a trench extending from a surface of the epitaxial layer 1f to the silicon substrate 1e. The trench is filled with an insulation layer so that element isolation can be achieved.

As described above, according to the eighth embodiment, the semiconductor substrate 1 is an epitaxial wafer. When an epitaxial wafer is used as the semiconductor substrate 1, the depletion layer can extend toward the silicon substrate 1e. However, within the epitaxial layer 1f, the depletion layer extends almost equally in the lateral direction of the semiconductor substrate 1. Therefore, the avalanche capability can be improved. Thus, the same effect as the first embodiment can be obtained.

(Ninth Embodiment)

Figure 20:
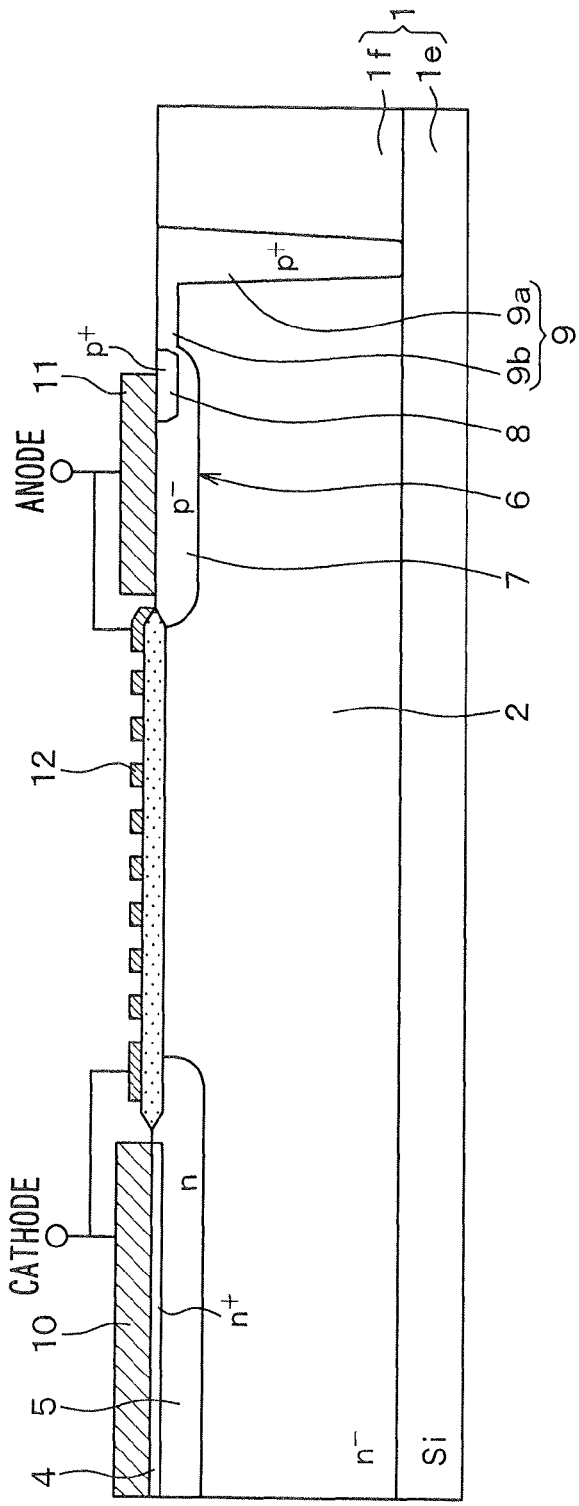
FIG. 20 is a diagram illustrating a cross-sectional view of a semiconductor device having a lateral diode according to a ninth embodiment of the present invention.

A ninth embodiment of the present invention is described below with reference to FIG. 20. The ninth embodiment is similar to the eighth embodiment. A difference between the eighth and ninth embodiments is as follows.

According to the ninth embodiment, like the eighth embodiment, the semiconductor substrate 1 is an epitaxial wafer. Unlike the eighth embodiment, the trench isolation structure 1d is not formed in the semiconductor substrate 1 so that only the anode extension portion 9 can extend from the surface of the epitaxial layer 1f to the silicon substrate 1e. Although the semiconductor substrate 1 has no trench isolation structure 1d, the depletion layer extends almost equally in the lateral direction of the semiconductor substrate 1 within the epitaxial layer 1f. Thus, the same effect as the first embodiment can be obtained.

The anode extension portion 9 can be formed by performing ion implantation of p-type impurities into the epitaxial layer 1f. Alternatively, the anode extension portion 9 can be formed by forming a trench in the epitaxial layer 1f and filling the trench with a p$^+$-type layer by epitaxial growth.

(Tenth Embodiment)

A tenth embodiment of the present invention is described below with reference to FIG. 21. A difference between the first and tenth embodiments is the structure of the semiconductor substrate 1.

Figure 21:
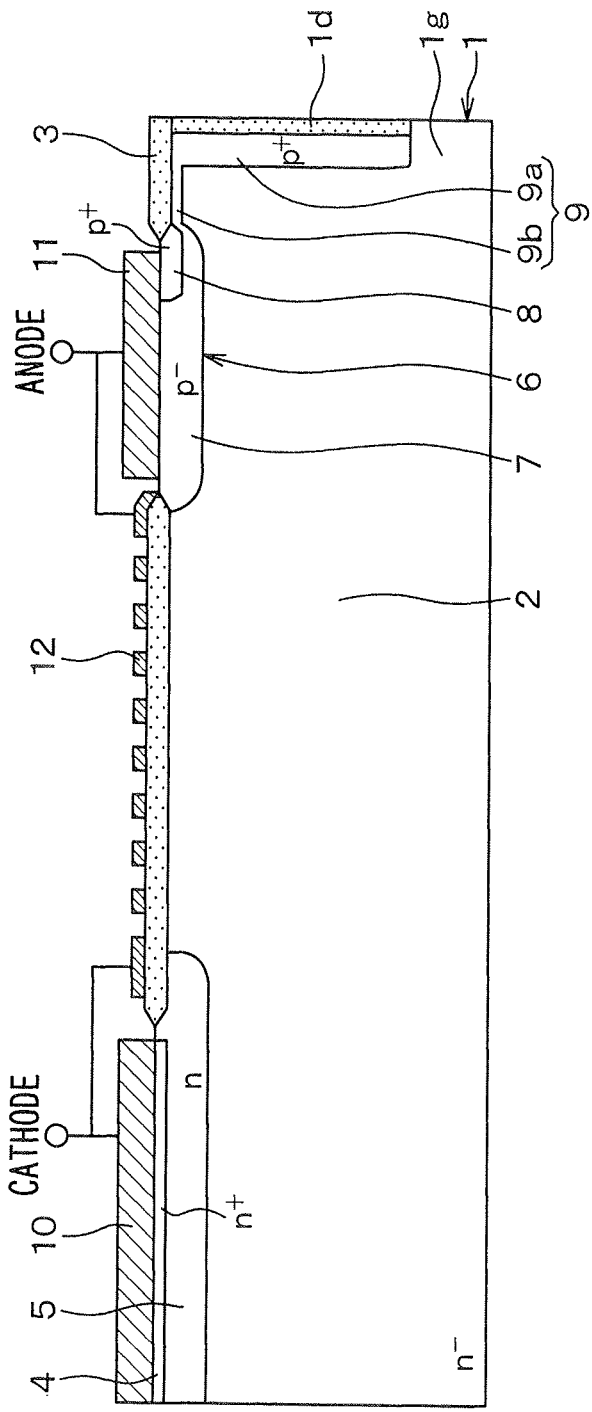
FIG. 21 is a diagram illustrating a cross-sectional view of a semiconductor device having a lateral diode according to a tenth embodiment of the present invention.

FIG. 21 is a diagram illustrating a cross-sectional view of a semiconductor device having a lateral diode according the tenth embodiment. As shown in FIG. 20, according to the tenth embodiment, the semiconductor substrate 1 is a bulk wafer. Specifically, the semiconductor substrate 1 includes only a silicon substrate 1g as a semiconductor layer. The silicon substrate 1g is an n$^-$-type silicon substrate and has a n-type impurity concentration of, for example, $7.0 \times 10^{14}$ cm$^{-3}$. The trench isolation structure 1d is formed in the semiconductor substrate 1. The trench isolation structure 1d extends from a surface of the silicon substrate 1g to a depth greater than a depth of the anode extension portion 9 so that element isolation can be achieved.

As described above, according to the tenth embodiment, the semiconductor substrate 1 is a bulk wafer. When a bulk wafer is used as the semiconductor substrate 1, the depletion layer can extend below the anode extension portion 9. However, at the depth of the anode extension portion 9, the depletion layer extends almost equally in the lateral direction of the semiconductor substrate 1. Therefore, the avalanche capability can be improved. Thus, the same effect as the first embodiment can be obtained.

The silicon substrate 1g can be thinned by polishing a back surface of the silicon substrate 1g until the anode extension portion 9 is exposed to the back surface of the silicon substrate 1g. In such an approach, the depletion layer does not extend below the anode extension portion 9. Therefore, the avalanche capability can be further improved.

(Eleventh Embodiment)

An eleventh embodiment of the present invention is described below with reference to FIG. 22. The eleventh embodiment is similar to the tenth embodiment. A difference between the tenth and eleventh embodiments is the structure of the anode extension portion 9.

Figure 22:
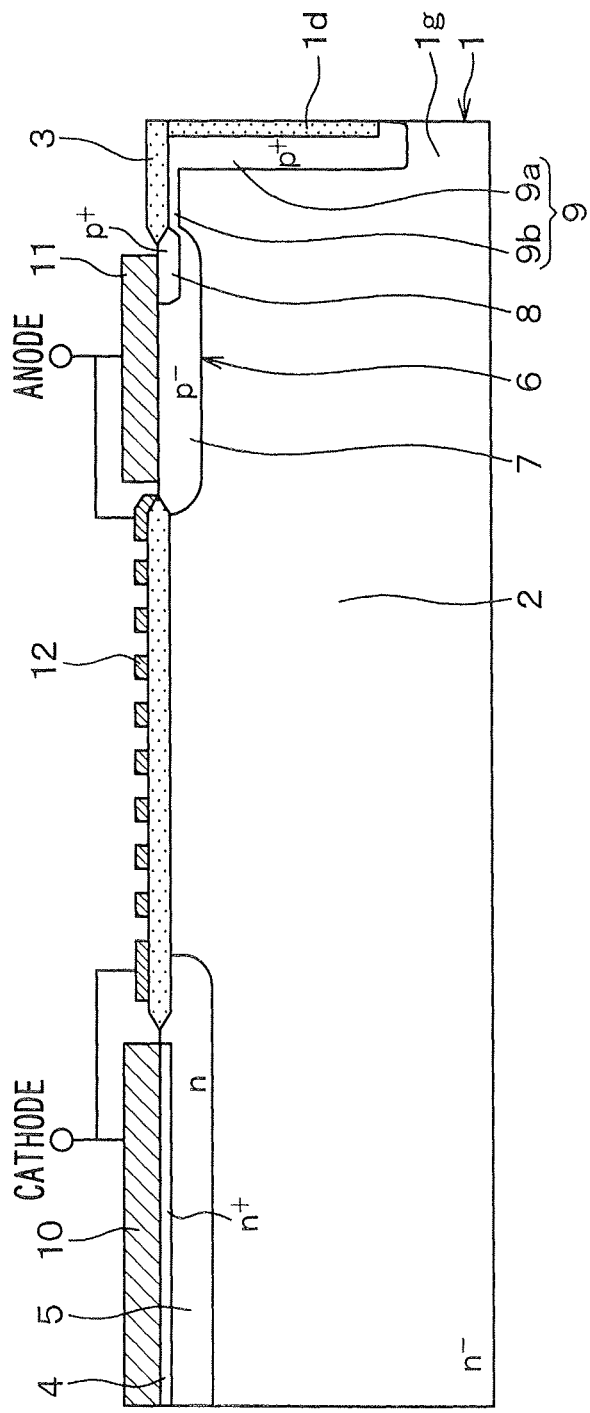
FIG. 22 is a diagram illustrating a cross-sectional view of a semiconductor device having a lateral diode according to an eleventh embodiment of the present invention.

FIG. 22 is a diagram illustrating a cross-sectional view of a semiconductor device having a lateral diode according the eleventh embodiment. As shown in FIG. 22, according to the eleventh embodiment, like the tenth embodiment, the semiconductor substrate 1 is a bulk wafer and includes the silicon substrate 1g. Unlike the tenth embodiment, the anode extension portion 9 extends to below the trench isolation structure 1d so that the bottom of the trench isolation structure 1d can be covered with the anode extension portion 9. Even in such a structure as shown in FIG. 22, the same effect as the tenth embodiment can be obtained.

(Twelfth Embodiment)

A twelfth embodiment of the present invention is described below with reference to FIG. 23. The twelfth embodiment is similar to the tenth embodiment. A difference between the tenth and twelfth embodiments is as follows.

Figure 23:
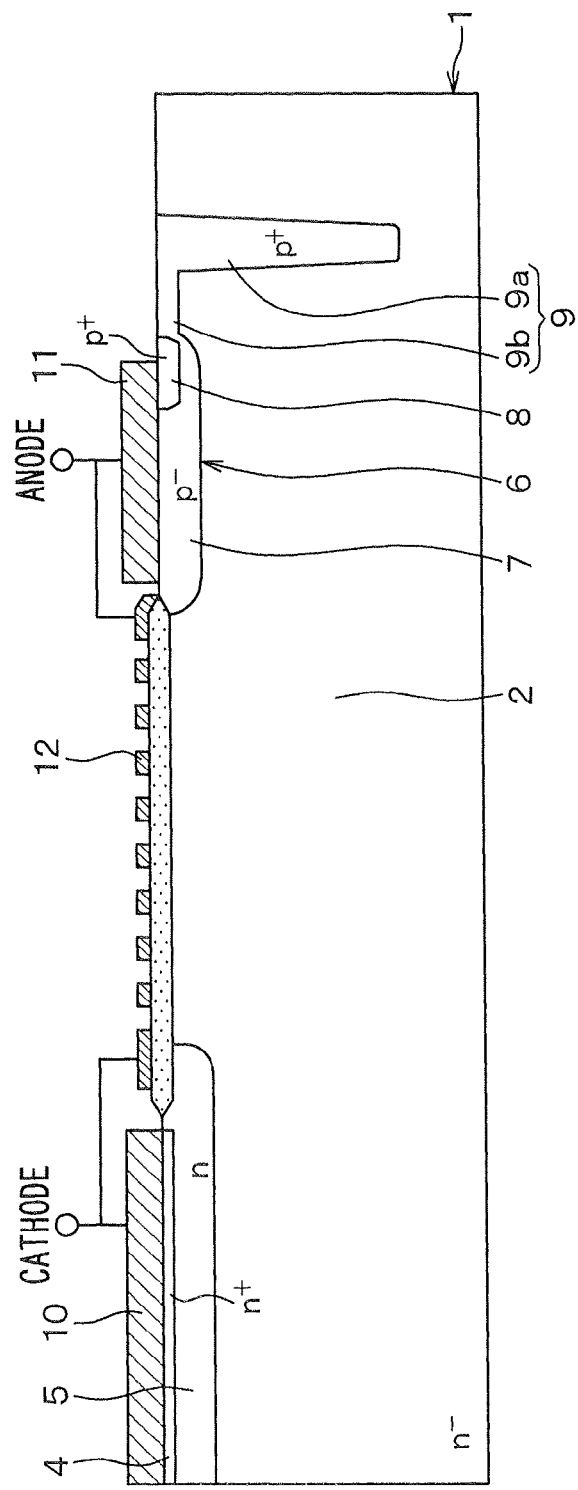
FIG. 23 is a diagram illustrating a cross-sectional view of a semiconductor device having a lateral diode according to a twelfth embodiment of the present invention.

FIG. 23 is a diagram illustrating a cross-sectional view of a semiconductor device having a lateral diode according the twelfth embodiment. As shown in FIG. 23, according to the twelfth embodiment, like the tenth embodiment, the semiconductor substrate 1 is a bulk wafer and includes only the silicon substrate 1g. Unlike the tenth embodiment, the trench isolation structure 1d is not formed in the semiconductor substrate 1 so that only the anode extension portion 9 can extend from the surface of the silicon substrate 1g to a predetermined depth of the silicon substrate 1g. Although the semiconductor substrate 1 has no trench isolation structure 1d, the depletion layer extends almost equally in the lateral direction of the semiconductor substrate 1 at the depth of the anode extension portion 9. Thus, the same effect as the first embodiment can be obtained.

The anode extension portion 9 can be formed by performing ion implantation of p-type impurities into the silicon substrate 1g. Alternatively, the anode extension portion 9 can be formed by forming a trench in the silicon substrate 1g and filling the trench with a $p^+$-type layer by epitaxial growth.

(Thirteenth Embodiment)

A thirteenth embodiment of the present invention is described below with reference to FIG. 24. A difference of the thirteenth embodiment from the preceding embodiments is the structure of the cathode electrode 10.

Figure 24:
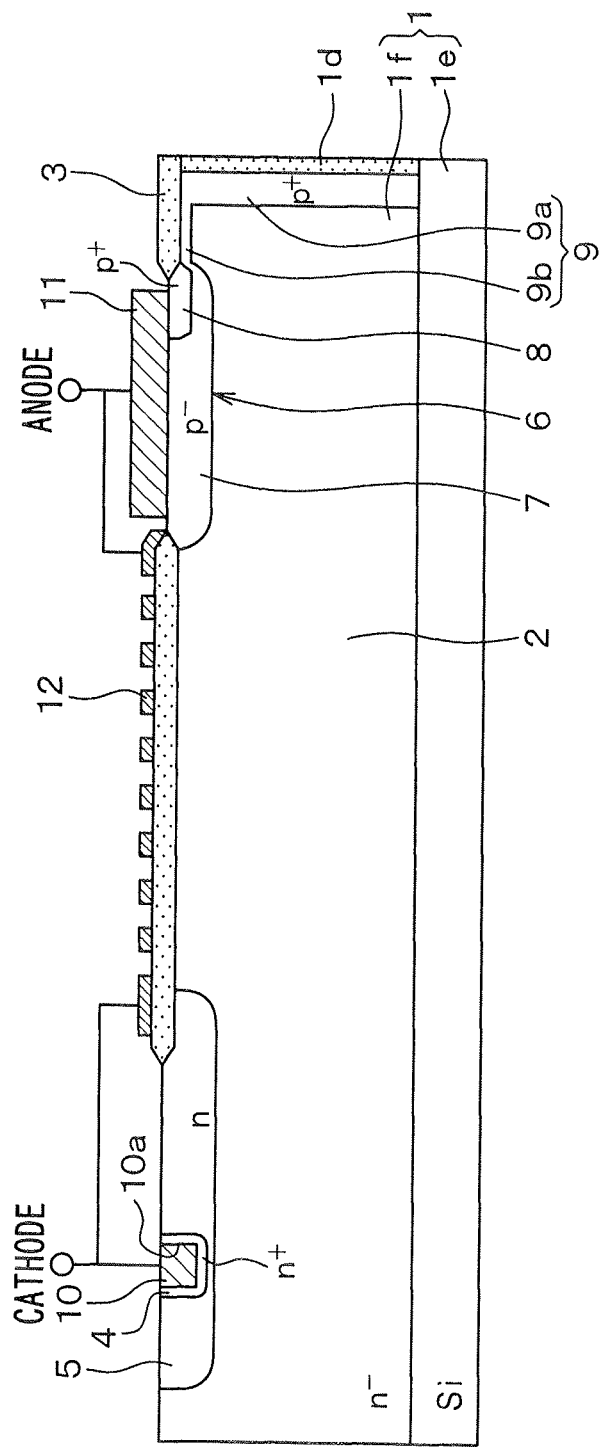
FIG. 24 is a diagram illustrating a cross-sectional view of a semiconductor device having a lateral diode according to a thirteenth embodiment of the present invention.

FIG. 24 is a diagram illustrating a cross-sectional view of a semiconductor device having a lateral diode according the thirteenth embodiment. FIG. 24 illustrates an example of the thirteenth embodiment obtained by modifying the structure of the cathode electrode 10 of the eighth embodiment shown in FIG. 19. The cathode electrode 10 of the other preceding embodiments can be modified in the same manner as shown in FIG. 24.

As shown in FIG. 24, according to the thirteenth embodiment, a trench 10a is formed in the buffer layer 5 in the epitaxial layer 1f. The cathode contact region 4 is formed on an inner surface of the trench 10a, and the cathode electrode 10 is formed on the cathode contact region 4 so that the trench 10a can be filled with the cathode contact region 4 and the cathode electrode 10. Even in such a structure as shown in FIG. 24, the same effect as the eighth embodiment can be obtained.

(Fourteenth Embodiment)

A fourteenth embodiment of the present invention is described below with reference to FIG. 25. A difference of the fourteenth embodiment from the preceding embodiments is the structure of the anode electrode 11.

Figure 25:
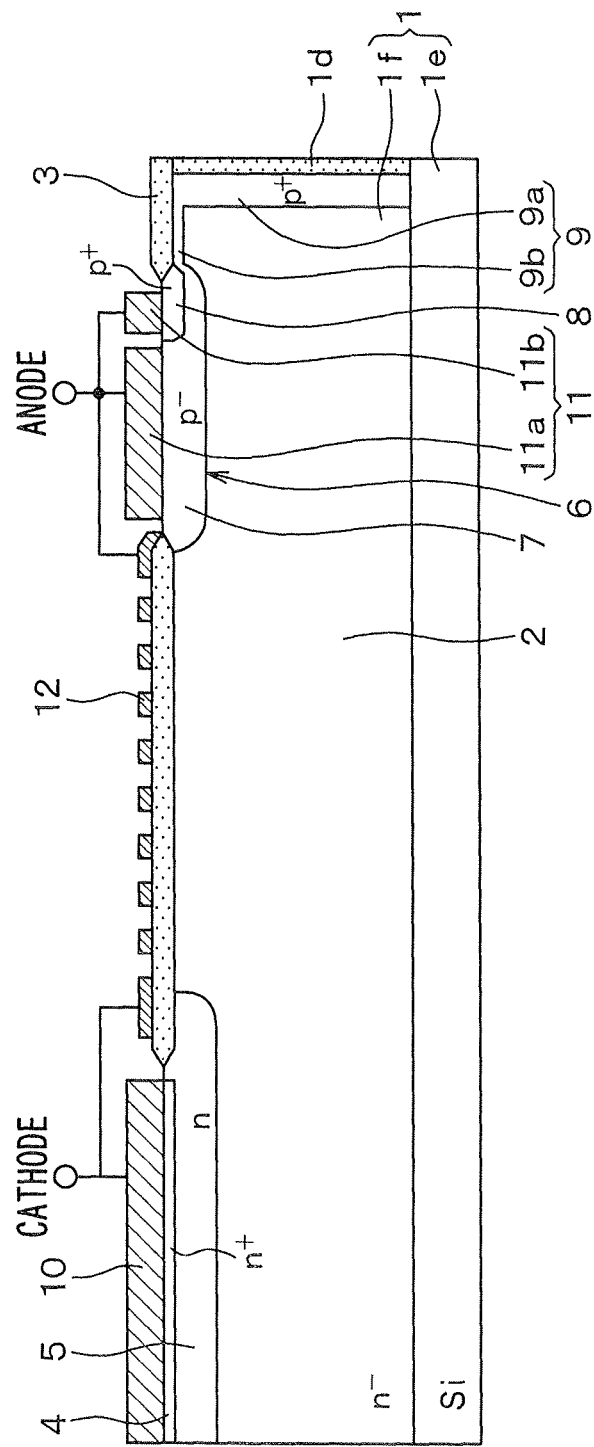
FIG. 25 is a diagram illustrating a cross-sectional view of a semiconductor device having a lateral diode according to a fourteenth embodiment of the present invention.

FIG. 25 is a diagram illustrating a cross-sectional view of a semiconductor device having a lateral diode according the fourteenth embodiment. FIG. 25 illustrates an example of the fourteenth embodiment obtained by modifying the structure of the anode electrode 11 of the eighth embodiment shown in FIG. 19. The anode electrode 11 of the other preceding embodiments can be modified in the same manner as shown in FIG. 25.

As shown in FIG. 25, according to the fourteenth embodiment, the anode electrode 11 is divided into two electrodes 11a, 11b. One electrode 11a is a Schottky electrode electrically connected to the low impurity concentration portion 7, and the other electrode 11b is an ohmic electrode electrically connected to the high impurity concentration portion 8. The Schottky electrode 11a and the ohmic electrode 11b are electrically connected together through a wiring pattern formed in an upper layer such as an interlayer dielectric layer. Even in such a structure as shown in FIG. 25, the same effect as the eighth embodiment can be obtained.

(Fifteenth Embodiment)

A fifteenth embodiment of the present invention is described below with reference to FIG. 26. A difference of the fifteenth embodiment from the preceding embodiments is the structures of the cathode electrode 10 and the anode electrode 11.

Figure 26:
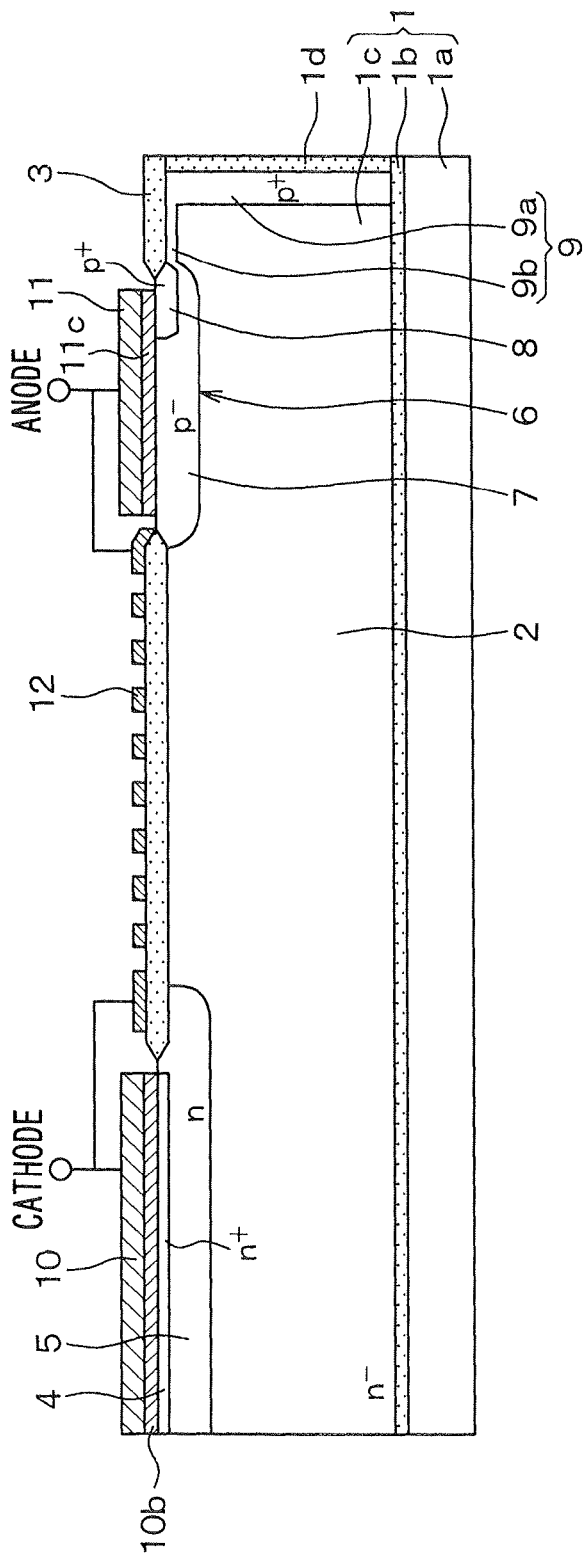
FIG. 26 is a diagram illustrating a cross-sectional view of a semiconductor device having a lateral diode according to a fifteenth embodiment of the present invention.

FIG. 26 is a diagram illustrating a cross-sectional view of a semiconductor device having a lateral diode according the fifteenth embodiment. FIG. 26 illustrates an example of the fifteenth embodiment obtained by modifying the structures of the cathode electrode 10 and the anode electrode 11 of the first embodiment. The cathode electrode 10 and the anode electrode 11 of the other preceding embodiments can be modified in the same manner as shown in FIG. 26.

As shown in FIG. 26, according to the fifteenth embodiment, the cathode electrode 10 has a barrier metal layer 10b. The barrier metal layer 10b can be made of TiN, Tai, or TaN. When the cathode electrode 10 is made of an electrode material, such as AlSi or AlSiCu, mainly containing Al, the cathode electrode 10 may be broken, for example, due to interdiffusion between the electrode material and a semiconductor material (e.g., Si), of which the active layer 1c is made. The barrier metal layer 10b is located between the cathode electrode 10 and the cathode contact region 4 to protect the cathode electrode 10.

Likewise, the anode electrode 11 has a barrier metal layer 11c. The barrier metal layer 11c can be made of TiN, Tai, or TaN. The barrier metal layer 11c is located between the anode electrode 11 and the anode region 6 to protect the anode electrode 11.

As described above, according to the fifteenth embodiment, the cathode electrode 10 has the barrier metal layer 10b, and the anode electrode 11 has the barrier metal layer 11c. In such an approach, the cathode electrode 10 and the anode electrode 11 can be protected from damage caused by the interdiffusion. Thus, reliability of the cathode electrode 10 and the anode electrode 11 can be improved. Further, since the barrier metal layer 11c reduces the Schottky barrier height, Therefore, the amount of injected holes is reduced so that the reverse recovery charge Qrr can be reduced.

The barrier metal layers 10b, 11c can be formed in the process shown in FIG. 8C. Specifically, a barrier material layer 1c formed on the interlayer dielectric film, and then the conductor layer 1c formed on the barrier material layer. Then, the barrier material layer and the conductor layer are patterned so that the barrier metal layers 10b, 11c and the cathode electrode 10 and the anode electrode 11 can be formed at the same time.

(Modifications)

The embodiments described above can be modified in various ways, for example, as follows.

In the above embodiments, the anode extension portion 9 is in contact with the side surface of the trench isolation structure 1d and located outside the low impurity concentration portion 7 and the high impurity concentration portion 8 with respect to the cathode contact region 4. Alternatively, the anode extension portion 9 can be separated from the trench isolation structure 1d, as long as the anode extension portion 9 is located outside the low impurity concentration portion 7 and the high impurity concentration portion 8 with respect to the cathode contact region 4. A reason for this is discussed below with reference to FIGS. 27A-27F and FIG. 28.

Figure 28:
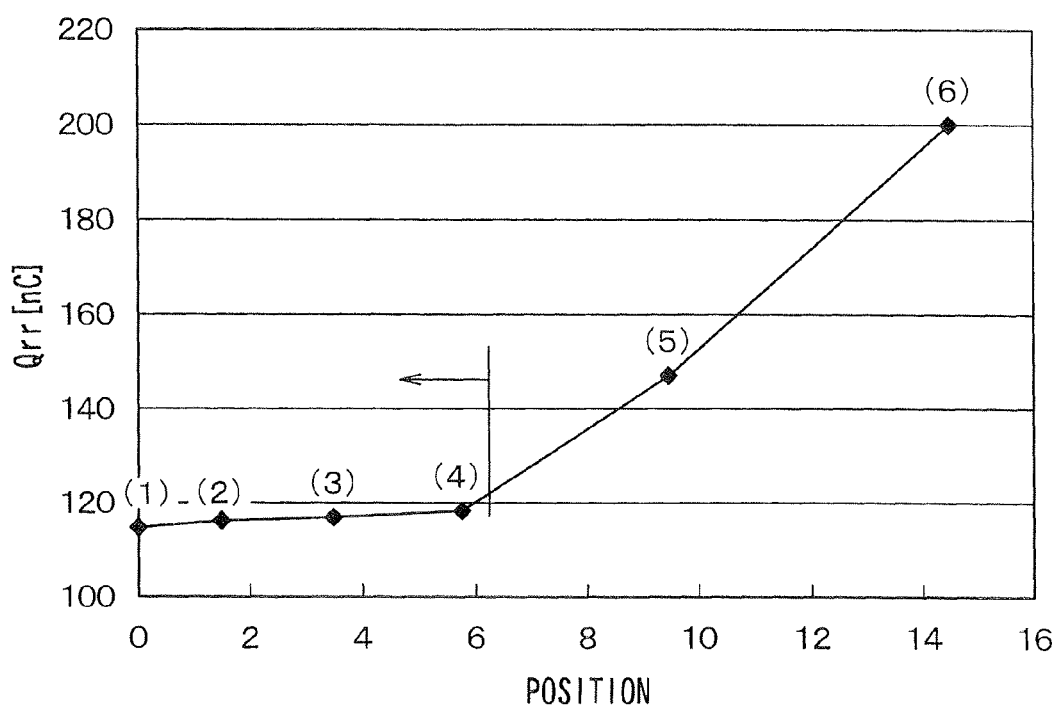
FIG. 28 is a diagram illustrating a result of an experiment conducted to measure a relationship between a reverse recovery charge and the separation distance shown in FIGS. 27A-27F.

FIGS. 27A-27F are diagrams illustrating the semiconductor device in which the anode extension portion 9 is separated from the trench isolation structure 1d by 0 µm, 1.5 µm, 3.5 µm, 5.75 µm, 9.5 µm, and 14.5 µm, respectively. FIG. 28 is a diagram illustrating a result of an experiment conducted by the present inventors to measure a relationship between the position (i.e., separation distance) of the anode extension portion 9 from the trench isolation structure 1d and the reverse recovery charge Qrr.

As shown in FIG. 28, the reverse recovery charge Qrr increases as the anode extension portion 9 approaches the cathode contact region 4. From the standpoint of recovery loss, it is preferable that the reverse recovery charge Qrr be 120nC or less. As can be seen from FIGS. 27A-27C and FIG. 28, when the separation distance of the anode extension portion 9 is 3.5 µm or less, it is ensured that the reverse recovery charge Qrr be 120nC or less. In FIGS. 27A-27C, the anode extension portion 9 is located outside the low impurity concentration portion 7 and the high impurity concentration portion 8 with respect to the cathode contact region 4.

For the above reason, the anode extension portion 9 can be separated from the trench isolation structure 1d, as long as the anode extension portion 9 is located outside the low impurity concentration portion 7 and the high impurity concentration portion 8 with respect to the cathode contact region 4.

In the above embodiments, the anode electrode 11 is located almost all over the low impurity concentration portion 7 and the high impurity concentration portion 8 exposed outside the LOCOS oxide layer 3. However, as long as the anode electrode 11 is in contact with each of the low impurity concentration portion 7 and the high impurity concentration portion 8, there is no need that the anode electrode 11 is located almost all over the low impurity concentration portion 7 and the high impurity concentration portion 8 exposed outside the LOCOS oxide layer 3. That is, even when the sizes of the contact areas between the anode electrode 11 and each of the low impurity concentration portion 7 and the high impurity concentration portion 8 are small, the recovery loss can be reduced.

Figure 29:
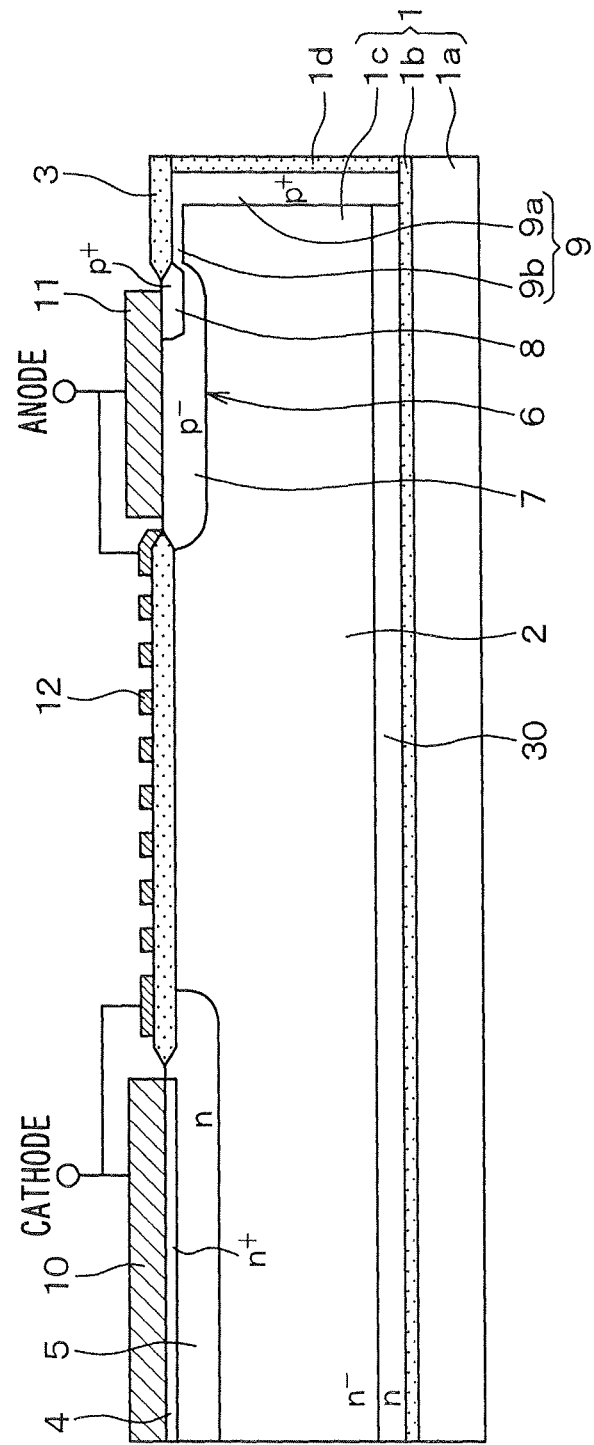
FIG. 29 is a diagram illustrating a cross-sectional view of a semiconductor device having a lateral diode according to a modification of the present invention.

As shown in FIG. 29, an n-type impurity region 30 having an impurity concentration greater than that of the cathode layer 2 can be interposed between the active layer 1c and the BOX layer 1b. In such an approach, voltage breakdown resistance can be improved. For example, when the n-type impurity region 30 has a thickness of 4 µm and an n-type impurity concentration of $1.25 \times 10^{16}$ cm$^{-3}$, it is preferable that the n-type impurity concentration of the cathode layer 2 be about $1.0 \times 10^{14}$ cm$^{-3}$, and the p-type impurity concentration of the low impurity concentration portion 7 be about $3.0 \times 10^{16}$ cm$^{-3}$. In this case, it is preferable that the n-type impurity concentration of the cathode contact region 4 be about $6.0 \times 10^{20}$ cm$^{-3}$, and the n-type impurity concentration of the buffer layer 5 be about $3.44 \times 10^{17}$ cm$^{-3}$.

The n-type impurity region 30 can be formed by implanting n-type impurities into a surface of the silicon substrate for the active layer 1c, and then bonding the surface of the silicon substrate to the supporting substrate 1a through the BOX layer 1b.

In the sixth embodiment, the straight portion of the high impurity concentration portion 8 is located in the center of the low impurity concentration portion 7 in the width direction of the low impurity concentration portion 7, and the projections of the high impurity concentration portion 8 extend from the straight portion and are connected to the anode extension portion 9. Alternatively, the high impurity concentration portion 8 can have no projections and be disconnected from the anode extension portion 9. However, from the standpoint of carrier drawing effect, it is preferable that the high impurity concentration portion 8 be connected from the anode extension portion 9.

Figure 30:
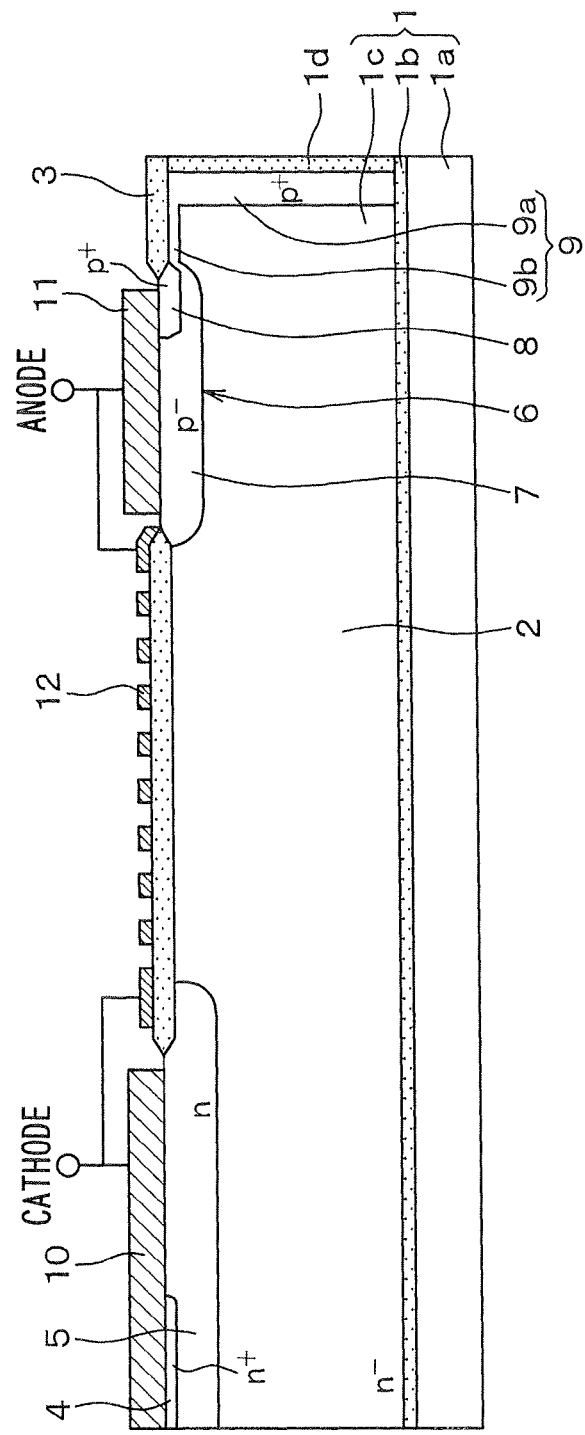
FIG. 30 is a diagram illustrating a cross-sectional view of a semiconductor device having a lateral diode according to another modification of the present invention.
Figure 31:
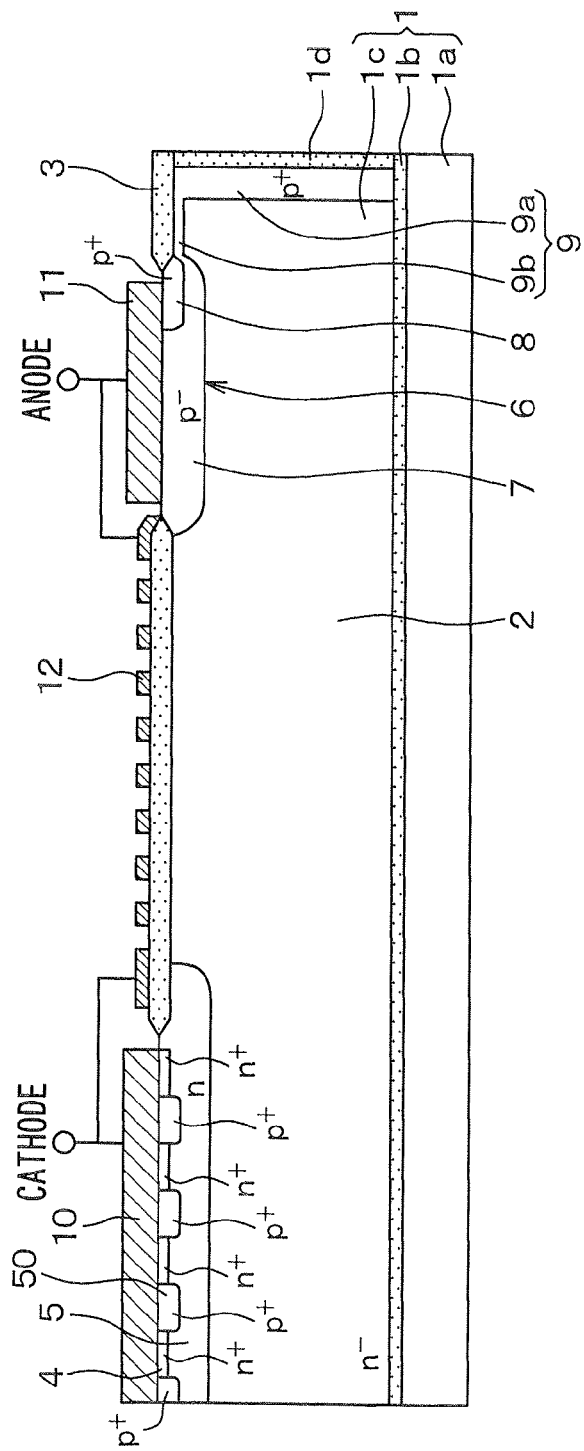
FIG. 31 is a diagram illustrating a cross-sectional view of a semiconductor device having a lateral diode according to another modification of the present invention.

In the above embodiments, the cathode contact region 4 is located all over the bottom surface of the cathode electrode 10. Alternatively as shown in FIGS. 30 and 31, the cathode contact region 4 can be in contact with only a portion of the bottom surface of the cathode electrode 10. In an example shown FIG. 30, the cathode contact region 4 is in contact with only a portion of the bottom surface of the cathode electrode 10, and the remaining portion of the bottom surface of the cathode electrode 10 is in contact with the buffer layer 5. In an example shown in FIG. 31, the cathode contact region 4 and a p$^+$-type layer 50 are located on the bottom surface of the cathode electrode 10 and alternately arranged in a stripe manner so that the cathode electrode 10 can be electrically connected to the cathode contact region 4 and the p$^+$-type layer 50. For example, the p$^+$-type layer 50 can have a p-type impurity concentration of $1.0 \times 10^{20}$ cm$^{-3}$ and a thickness of 0.55 µm.

Figure 32:
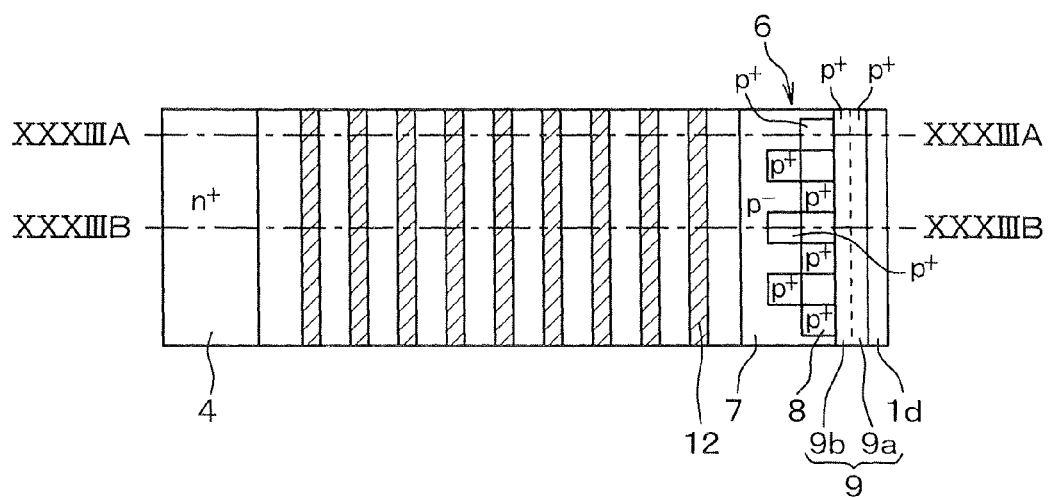
FIG. 32 is a diagram illustrating an enlarged partial top view of a semiconductor device according to another modification of the present invention.
Figure 33:
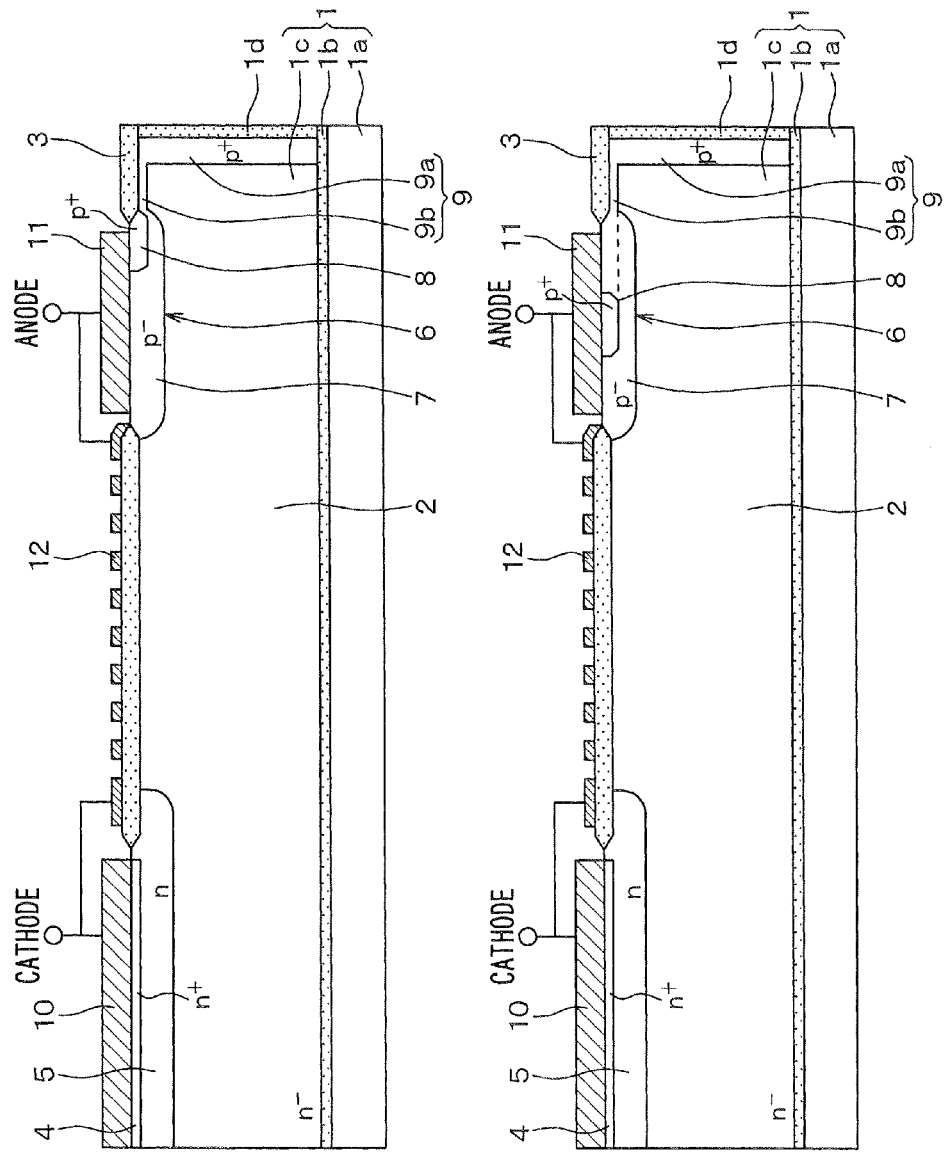
FIG. 33A is a diagram taken along the line XXXIIIA-XXXIIIA in FIG. 32.
FIG. 33B is a diagram taken along the line XXXIIIB-XXXIIIB in FIG. 32.

As shown in FIG. 32 and FIGS. 33A and 33B, the high impurity concentration portion 8 can be divided into first and second portions. FIG. 32 is a diagram corresponding to FIG. 2A and illustrating a partial enlarged top view of a semiconductor device having a lateral diode according to a modification. FIG. 33A is a diagram illustrating a cross-sectional view taken along the line XXXIIIA-XXXIIIA in FIG. 32, and FIG. 33B is a diagram illustrating a cross-sectional view taken along the line XXXIIIB-XXXIIIB in FIG. 32. Like the first embodiment, the first portion of the high impurity concentration portion 8 is located in the low impurity concentration portion 7 at a position furthest away from the cathode contact region 4. Like the sixth embodiment, the second portion of the high impurity concentration portion 8 is located in the center of the low impurity concentration portion 7 in the width direction of the low impurity concentration portion 7.

Figure 34:
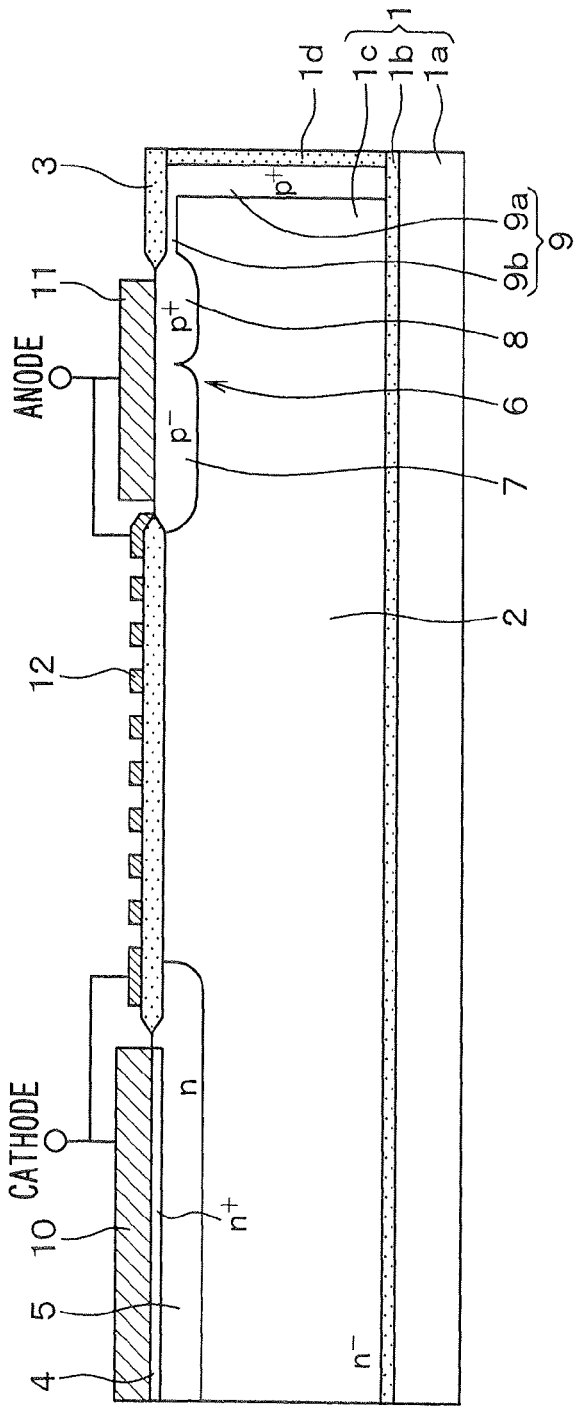
FIG. 34 is a diagram illustrating a cross-sectional view of a semiconductor device having a lateral diode according to another modification of the present invention.

In the above embodiments, the high impurity concentration portion 8 is surrounded by the low impurity concentration portion 7. Alternatively, as shown in FIG. 34, the high impurity concentration portion 8 can be located outside the low impurity concentration portion 7. In an example shown in FIG. 34, the high impurity concentration portion 8 is in contact with the low impurity concentration portion 7 and located further away from the cathode contact region 4 than the low impurity concentration portion 7.

Figure 35:
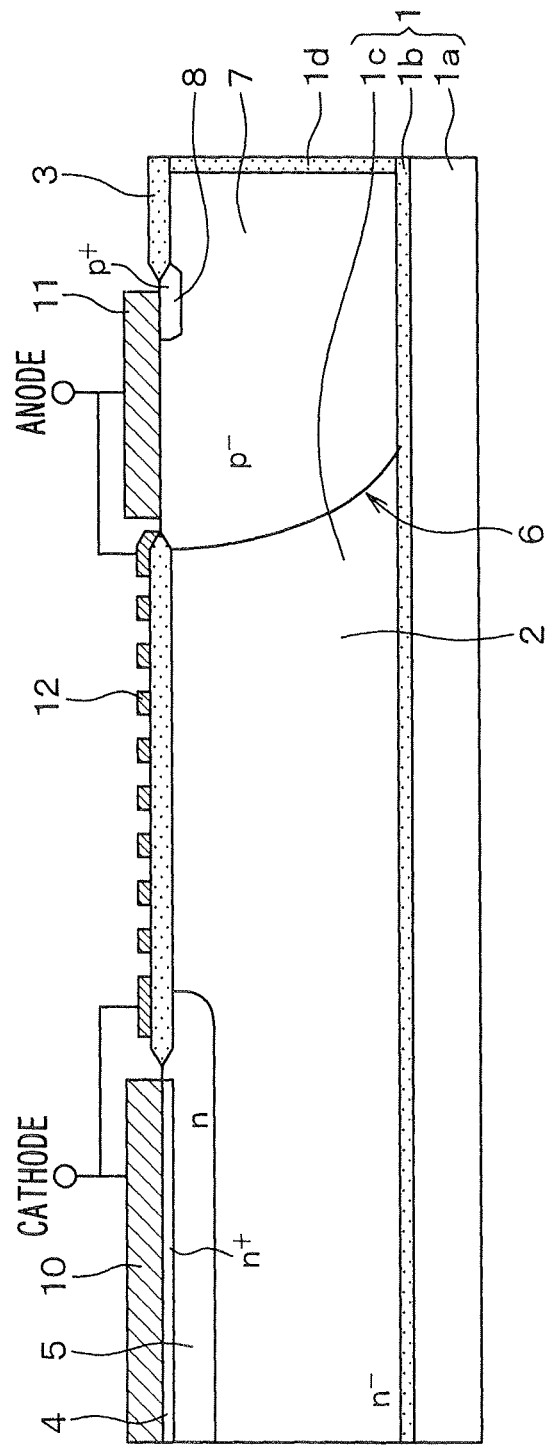
FIG. 35 is a diagram illustrating a cross-sectional view of a semiconductor device having a lateral diode according to another modification of the present invention.

In the above embodiments, the anode extension portion 9 is a separate piece of the anode region 6. Alternatively, as shown in FIG. 35, the anode extension portion 9 can be a single piece of the anode region 6.

That is, the anode region 6 can include the anode extension portion 9. In an example shown in FIG. 35, the low impurity concentration portion 7 has a p-type impurity concentration of about $3.0 \times 10^{16}$ cm$^{-3}$ and a thickness of 15 μm, and extends from the surface of the active layer 1c to the BOX layer 1b. Even in such a structure as shown in FIG. 35, the same effect as the above embodiments can be obtained.

Figure 36:
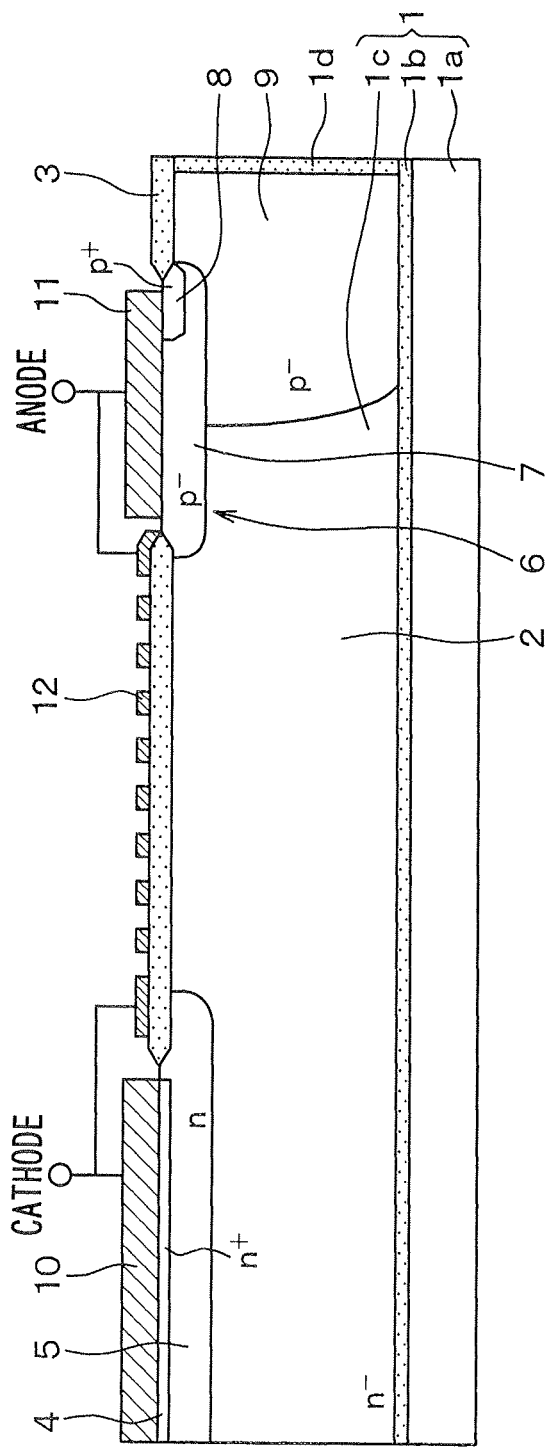
FIG. 36 is a diagram illustrating a cross-sectional view of a semiconductor device having a lateral diode according to another modification of the present invention.

Further, as shown in FIG. 36, the anode extension portion 9 can extend to below the anode region 6 so that at least a portion of the bottom surface of the anode region 6 can be covered with the anode extension portion 9. In an example shown in FIG. 36, the anode extension portion 9 has a p-type impurity concentration of about $3.0 \times 10^{16}$ cm$^{-3}$ and a thickness of 15 μm, and extends to below the low impurity concentration portion 7. Specifically, the anode extension portion 9 extends to a position below the low impurity concentration portion 7 and closer to the cathode contact region 4 than the high impurity concentration portion 8. Even in such a structure as shown in FIG. 36, the same effect as the above embodiments can be obtained.

In the above embodiments, as shown in FIG. 7A, the anode extension portion 9 is formed on the side surface of the trench isolation structure 1d by performing the oblique ion implantation. Alternatively, the anode extension portion 9 can be formed in a different process. For example, after a trench for the trench isolation structure 1d is formed, p-doped polysilicon or p-doped oxide layer 1c formed in the trench, and then solid-phase diffusion or vapor-phase diffusion is performed by thermal treatment so that the anode extension portion 9 can be formed on the side surface of the trench.

In the embodiments, the semiconductor device includes the IGBT along with the lateral diode. Alternatively, the semiconductor device can include other elements, such as a complementary metal-oxide semiconductor (CMOS) and a laterally diffused metal oxide semiconductor (LDMOS), along with the lateral diode. As described previously with reference to FIGS. 7A-7C and FIGS. 8A-8C, since the lateral diode and the IGBT are formed in the same process, the anode extension portion 9 is formed in the IGBT area in addition to the diode area. Likewise, when the lateral diode and the other element are formed in the same semiconductor substrate 1, the anode extension portion 9 is formed in the other element area in addition to the diode area.

Figure 37:
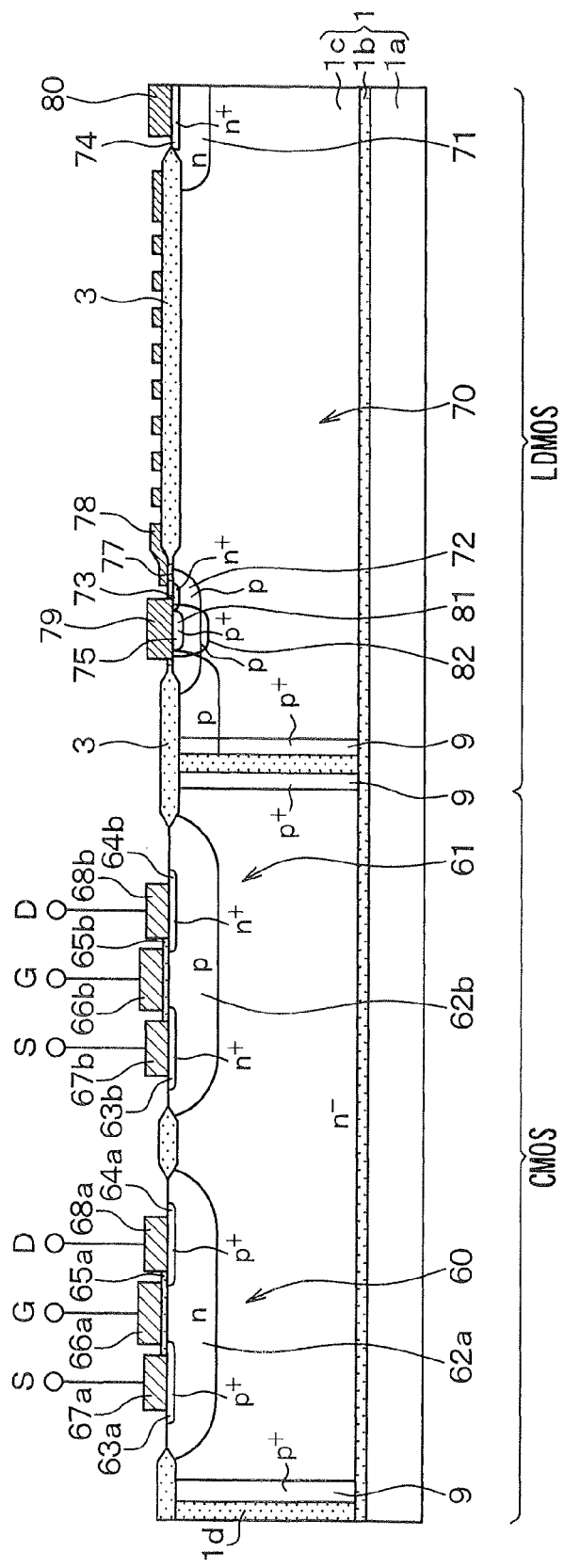
FIG. 37 is a diagram illustrating a cross-sectional view of a semiconductor device according to another modification of the present invention.

FIG. 37 is a diagram illustrating a cross-sectional view of a semiconductor device having a CMOS and a LDMOS along with the lateral diode and the IGBT. The lateral diode, the IGBT, the CMOS, and the LDMOS are formed in the same semiconductor substrate 1. However, for ease of understanding, the lateral diode and the IGBT are not shown in FIG. 37.

As shown in FIG. 37, the LDMOS and the CMOS are formed in the semiconductor substrate 1, which is a SOI substrate. A LDMOS area, where the LDMOS is formed, is isolated by the trench isolation structure 1d from a CMOS area, where the CMOS is formed. Thus, the LDMOS and the CMOS are isolated from each other. As shown in FIG. 7, the anode extension portion 9 is formed in each of the CMOS area and the LDMOS area.

In the CMOS area, the LOCOS oxide layer 3 is formed on the surface of the active layer 1c so that a P-channel MOSFET 60 and an N-channel MOSFET 61 can be isolated from each other. Specifically, an n-well layer 62a and a p-well layer 62b formed in a surface portion of the active layer 1c are isolated by the LOCOS oxide layer 3.

In the P-channel MOSFET 60, a p$^+$-type source region 63a and a p$^+$-type drain region 64a are formed in the n-well layer 62a. A gate electrode 66a is formed through a gate insulation layer 65a on a surface of the n-well layer 62a between the source region 63a and the drain region 64a. A source electrode 67a is formed on and electrically connected to the source region 63a, and a drain electrode 68a is formed on and electrically connected to the drain region 64a.

In the N-channel MOSFET 61, an n$^+$-type source region 63b and an n$^+$-type drain region 64b are formed in the p-well layer 62b. A gate electrode 66b is formed through a gate insulation layer 65b on a surface of the p-well layer 62b between the source region 63b and the drain region 64b. A source electrode 67b is formed on and electrically connected to the source region 63b, and a drain electrode 68b is formed on and electrically connected to the drain region 64b.

In this way, the CMOS having the P-channel MOSFET 60 and the N-channel MOSFET 61 is formed in the CMOS area.

In the LDMOS area, the LOCOS oxide layer 3 is formed on the surface of the active layer 1c so that parts of a LDMOS 70 can be isolated. The LDMOS 70 includes an n-type drain region 71, a p-type channel region 72, and an n$^+$-type source region 73 that are formed in the surface portion of the active layer 1c. An n$^+$-type contact layer 74 is formed in a surface portion of the drain region 71. A p$^+$-type contact layer 75 is formed in a surface portion of the channel region 72. The drain region 71 and the channel region are isolated from each other by the LOCOS oxide layer 3. A gate electrode 78 is formed through a gate insulation layer 77 on the channel region 72. A source electrode 79 is formed on the source region 73 and the contact layer 75 and electrically connected to the source region 73. A drain electrode 80 is formed on the contact layer 74 and electrically connected to the drain region 71 through the contact layer 74. Further, a p-type body layer 81 and a p-type deep layer 82 are formed. The body layer 81 overlaps the channel region 72 and extends deeper than the channel region 72. The deep layer 82 is located outside the body layer 81. The body layer 81 and the deep layer 82 increase the avalanche capability. In this way, the LDMOS 70 is formed in the LDMOS area.

As described above, the semiconductor device can include the CMOS and the LDMOS along with the lateral diode. In this case, as shown in FIG. 37, the anode extension portion 9 is formed on the side surface of the trench isolation structure 1d by which the CMOS area and the LSMOS area are isolated.

In the above embodiment, the lateral diode is configured such that the anode is located on each side of the cathode. Alternatively, the lateral diode can be configured such that the cathode is located on each side of the anode. That is, the conductivity-type can be reversed.

Specifically, in the embodiments, the n$^-$-type cathode layer 2 is defined as a first semiconductor region, the p-type anode region 6 is defined as a second semiconductor region, the cathode electrode 10 is defined as a first electrode electrically connected to the first semiconductor region, and the anode electrode 11 is defined as a second electrode electrically connected to the second semiconductor region. The second semiconductor region has the low impurity concentration portion 7 and the high impurity concentration portion 8, and the second electrode is electrically connected to the low impurity concentration portion 7 and the high impurity concentration portion 8 in such a manner that the second electrode forms an ohmic contact with the high impurity concentration portion 8. Further, the second semiconductor region has the p$^+$-type anode extension portion 9 extending in the depth direction of the semiconductor substrate 1 and having an impurity concentration greater than that of the low impurity concentration portion 7.

That is, in the embodiments, the first semiconductor region is of n-type, and the second semiconductor region is of p-type. Alternatively, the first semiconductor region can be of p-type, and the second semiconductor region can be of n-type. Even when the conductivity-type is reversed in this way, the same effect as the embodiments can be obtained. In each case, an electric potential is greater on the cathode-side than on the anode-side during ON-period of the IGBT, and the electric potential is greater on the anode-side than on the cathode-side during OFF-period of the IGBT.

Such changes and modifications are to be understood as being within the scope of the present invention as defined by the appended claims.

What is claimed is:

1. A semiconductor device having a lateral diode, the semiconductor device comprising:
    a semiconductor substrate including a first conductivity-type semiconductor layer;
    a first conductivity-type first semiconductor region located in the first conductivity-type semiconductor layer;
    a first conductivity-type contact region having an impurity concentration greater than an impurity concentration of the first conductivity-type first semiconductor region;
    a second conductivity-type second semiconductor region located in the first conductivity-type semiconductor layer and separated from the first conductivity-type contact region;
    a first electrode electrically connected through the first conductivity-type contact region to the first conductivity type first semiconductor region; and
    a second electrode electrically connected to the second conductivity-type second semiconductor region, wherein
    one of the first conductivity-type first semiconductor region and the second conductivity-type second semiconductor region is a cathode region,
    the other of the first conductivity-type first semiconductor region and the second conductivity-type second semiconductor region is an anode region,
    one of the first electrode and the second electrode is a cathode electrode of the lateral diode, the one of the first electrode and the second electrode being connected to the cathode region,
    the other of the first electrode and the second electrode is an anode electrode of the lateral diode, the other of the first electrode and the second electrode being connected to the anode region,
    the second conductivity-type second semiconductor region includes a low impurity concentration portion, a high impurity concentration portion, and an extension portion, the low impurity concentration portion is in contact with the high impurity concentration portion and has an impurity concentration less than an impurity concentration of the high impurity concentration portion,
    the second electrode forms an ohmic contact with the high impurity concentration portion,
    the extension portion has an impurity concentration greater than the impurity concentration of the low impurity concentration portion and extends in a thickness direction of the first conductivity-type semiconductor layer,
    the extension portion extends from a surface of the first conductivity-type semiconductor layer to a predetermined depth of the first conductivity-type semiconductor layer, and the predetermined depth is less than a thickness of the first conductivity-type semiconductor layer.

2. The semiconductor device according to claim 1, wherein
    the extension portion includes a first portion and a second portion,
    the first portion extends in the thickness direction of the first conductivity-type semiconductor layer, and
    the second portion is located in a surface portion of the first conductivity-type semiconductor layer and connects the first portion to the high impurity concentration portion.

3. The semiconductor device according to claim 1, wherein
    the impurity concentration of the low impurity concentration portion is $1.0 \times 10^{16}$ cm$^{-3}$ or less so that the second electrode forms a Schottky contact with the low impurity concentration portion, and
    the impurity concentration of the high impurity concentration portion is $1.0 \times 10^{19}$ cm$^{-3}$ or more so that the second electrode forms the ohmic contact with the high impurity concentration portion.

4. The semiconductor device according to claim 1, wherein
    the second conductivity-type second semiconductor region does not contact any other second conductivity type semiconductor region.

5. The semiconductor device according to claim 1, wherein
    the extension portion extends from a surface portion of the first conductivity-type semiconductor layer in a thickness direction of the first conductivity-type semiconductor layer and is located horizontally further away from the first conductivity-type contact region than are the low impurity concentration portion and the high impurity concentration portion.

6. The semiconductor device according to claim 1, wherein
    the extension portion includes a first portion and a second portion,
    the first portion extends from a surface portion of the first conductivity-type semiconductor layer in a thickness direction of the first conductivity-type semiconductor layer, and is located horizontally farther away from the first conductivity type contact region than are the low impurity concentration portion and the high impurity concentration portion, and
    the second portion is located between the first portion and the high impurity concentration portion at the surface portion of the first conductivity-type semiconductor layer, and connects the first portion to the high impurity concentration portion.

7. The semiconductor device according to claim 1, wherein
    the first conductivity-type contact region has a straight portion,
    the high impurity concentration portion has a straight portion on each side of the first conductivity-type contact region,
    the low impurity concentration portion has a straight portion on each side of the first conductivity-type contact region,
    the extension portion is located outside the low impurity concentration portion and the high impurity concentration portion with respect to the first conductivity-type contact region.

8. The semiconductor device according to claim 7, wherein
    the straight portion of the high impurity concentration portion is located on the far side of the low impurity concentration portion from the cathode contact region.

9. A semiconductor device having a lateral diode, the semiconductor device comprising:

a semiconductor substrate including a supporting substrate, an insulation layer on the supporting substrate, and a first conductivity-type semiconductor layer on the insulation layer;

an isolation structure extending from a surface of the first conductivity type semiconductor layer to the insulation layer;

a first conductivity-type first semiconductor region located in the first conductivity-type semiconductor layer isolated by the isolation structure;

a first conductivity-type contact region having an impurity concentration greater than an impurity concentration of the first conductivity-type first semiconductor region;

a first electrode electrically connected to the first conductivity-type contact region;

a second conductivity-type second semiconductor region located in the first conductivity- first semiconductor region and separated from the first conductivity-type contact region, the second conductivity-type second semiconductor region including a low impurity concentration portion and a high impurity concentration portion, the low impurity concentration portion being in contact with the high impurity concentration portion and having an impurity concentration less than an impurity concentration of the high impurity concentration portion;

a second electrode electrically connected to the low impurity concentration portion and the high impurity concentration portion, the second electrode forming an ohmic contact with the high impurity concentration portion; and a second conductivity-type extension portion located in the first conductivity-type semiconductor layer and having an impurity concentration greater than the impurity concentration of the low impurity concentration portion, wherein the second conductivity type extension portion extends in a thickness direction of the first conductivity-type semiconductor layer and is located horizontally further away from the first conductivity-type contact region than are the low impurity concentration portion and the high impurity concentration portion;

the extension portion extends from a surface of the first conductivity-type semiconductor layer to a predetermined depth of the first conductivity-type semiconductor layer, and the predetermined depth is less than a thickness of the first conductivity-type semiconductor layer.

10. The semiconductor device according to claim 9, wherein the second conductivity-type extension portion is in contact with the low impurity concentration portion and the high impurity concentration portion of the second conductivity-type semiconductor region, and the second conductivity-type second semiconductor region is not in contact with any other second conductivity-type semiconductor region.

11. The semiconductor device according to claim 9, wherein the second conductivity type extension portion includes a first portion and a second portion, the first portion extends from a surface portion of the first conductivity-type semiconductor layer in a thickness direction of the first conductivity-type semiconductor layer, and is located horizontally farther away from the first conductivity type contact region than are the low impurity concentration portion and the high impurity concentration portion, and the second portion is located between the first portion and the high impurity concentration portion at the surface portion of the first conductivity-type semiconductor layer, and connects the first portion to the high impurity concentration portion.

12. The semiconductor device according to claim 9, wherein the second conductivity type extension portion includes a first portion and a second portion, the first portion extends in the thickness direction of the first conductivity-type semiconductor layer, and the second portion is located in a surface portion of the first conductivity-type semiconductor layer and connects the first portion to the high impurity concentration portion.

13. The semiconductor device according to claim 12, wherein the first conductivity-type contact region has a straight portion, the high impurity concentration portion has a straight portion on each side of the first conductivity-type contact region, the low impurity concentration portion has a straight portion on each side of the first conductivity-type contact region, the second conductivity type extension portion is located outside the low impurity concentration portion and the high impurity concentration portion with respect to the first conductivity-type contact region.

14. The semiconductor device according to claim 13, wherein the straight portion of the high impurity concentration portion is located on the far side of the low impurity concentration portion from the cathode contact region.

* * * * *